United States Patent
Lien et al.

(10) Patent No.: US 11,361,835 B1
(45) Date of Patent: Jun. 14, 2022

(54) COUNTERMEASURE FOR REDUCING PEAK CURRENT DURING PROGRAMMING BY OPTIMIZING TIMING OF LATCH SCAN OPERATIONS

(71) Applicant: SanDisk Technologies LLC, Addison, TX (US)

(72) Inventors: Yu-Chung Lien, San Jose, CA (US); Fanglin Zhang, Fremont, CA (US); Huai-Yuan Tseng, San Ramon, CA (US)

(73) Assignee: SanDisk Technologies LLC, Addison, TX (US)

(*) Notice: Subject to any disclaimer, the term of this patent is extended or adjusted under 35 U.S.C. 154(b) by 0 days.

(21) Appl. No.: 17/188,998

(22) Filed: Mar. 1, 2021

(51) Int. Cl.
| G11C 16/10 | (2006.01) |
| G11C 16/34 | (2006.01) |
| G11C 16/08 | (2006.01) |
| G11C 16/30 | (2006.01) |
| G11C 16/26 | (2006.01) |

(52) U.S. Cl.
CPC .......... *G11C 16/3459* (2013.01); *G11C 16/08* (2013.01); *G11C 16/10* (2013.01); *G11C 16/26* (2013.01); *G11C 16/30* (2013.01)

(58) Field of Classification Search
CPC ..... G11C 16/3459; G11C 16/08; G11C 16/10; G11C 16/26; G11C 16/30
See application file for complete search history.

(56) References Cited

U.S. PATENT DOCUMENTS

| 9,305,610 | B2 | 4/2016 | Smith et al. |
| 9,437,302 | B2 | 9/2016 | Tseng et al. |
| 10,037,785 | B2 | 7/2018 | Alzheimer et al. |
| 10,134,474 | B1 | 11/2018 | Chen |
| 10,297,337 | B2 | 5/2019 | Tsai et al. |
| 10,325,658 | B2 | 6/2019 | Lee |
| 10,535,401 | B2 | 1/2020 | Lin et al. |
| 10,838,726 | B1 | 11/2020 | Peng et al. |
| 2010/0002507 | A1 | 1/2010 | Kang et al. |
| 2010/0182841 | A1 | 7/2010 | Lee |
| 2015/0071006 | A1 | 3/2015 | Harada et al. |
| 2018/0240515 | A1 | 8/2018 | Shibata et al. |
| 2019/0304549 | A1* | 10/2019 | Yang ............. G11C 16/24 |

OTHER PUBLICATIONS

International Search Report & The Written Opinion of the International Searching Authority dated Nov. 25, 2021, International Application No. PCT/US2021/033653.

* cited by examiner

*Primary Examiner* — Xiaochun L Chen

(74) *Attorney, Agent, or Firm* — Vierra Magen Marcus LLP

(57) ABSTRACT

Apparatuses and techniques are described for avoiding current consumption peaks during a program operation for a memory device. The timing of scan operations of latches is adjusted to avoid overlapping with an increase in word line voltages. The scan operations can include a pre-charge select scan, which identifies memory cells subject to a verify test, and a fill operation for latches of memory cells which fail a verify test in a prior program loop. The pre-charge select scan can occur before the increase in the word line voltages, while the fill operation occurs after the increase in word line voltages. In another approach, the start of the increase in the word line voltages is delayed when a state bit scan is expected to take a relatively long time, e.g., when a verify test is passed in a prior program loop.

20 Claims, 16 Drawing Sheets

Fig. 1A
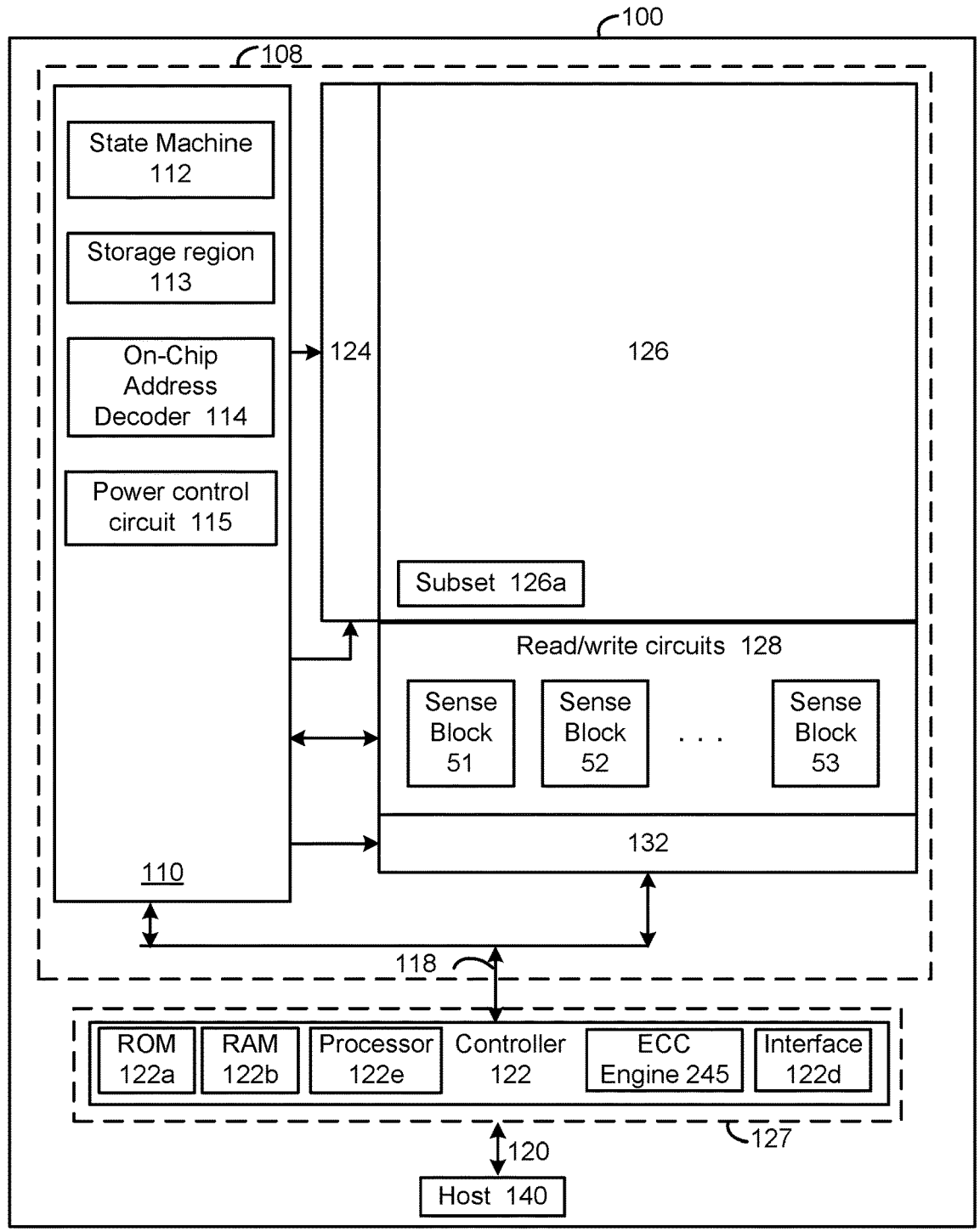
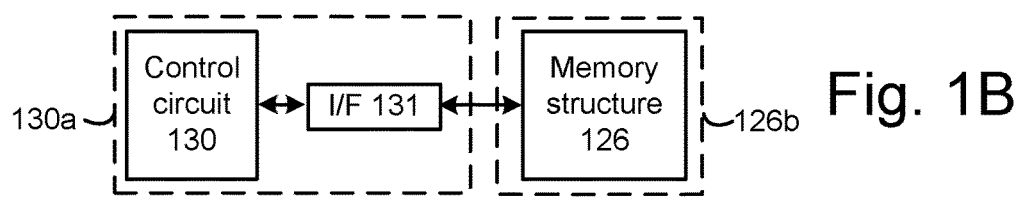
Fig. 1B

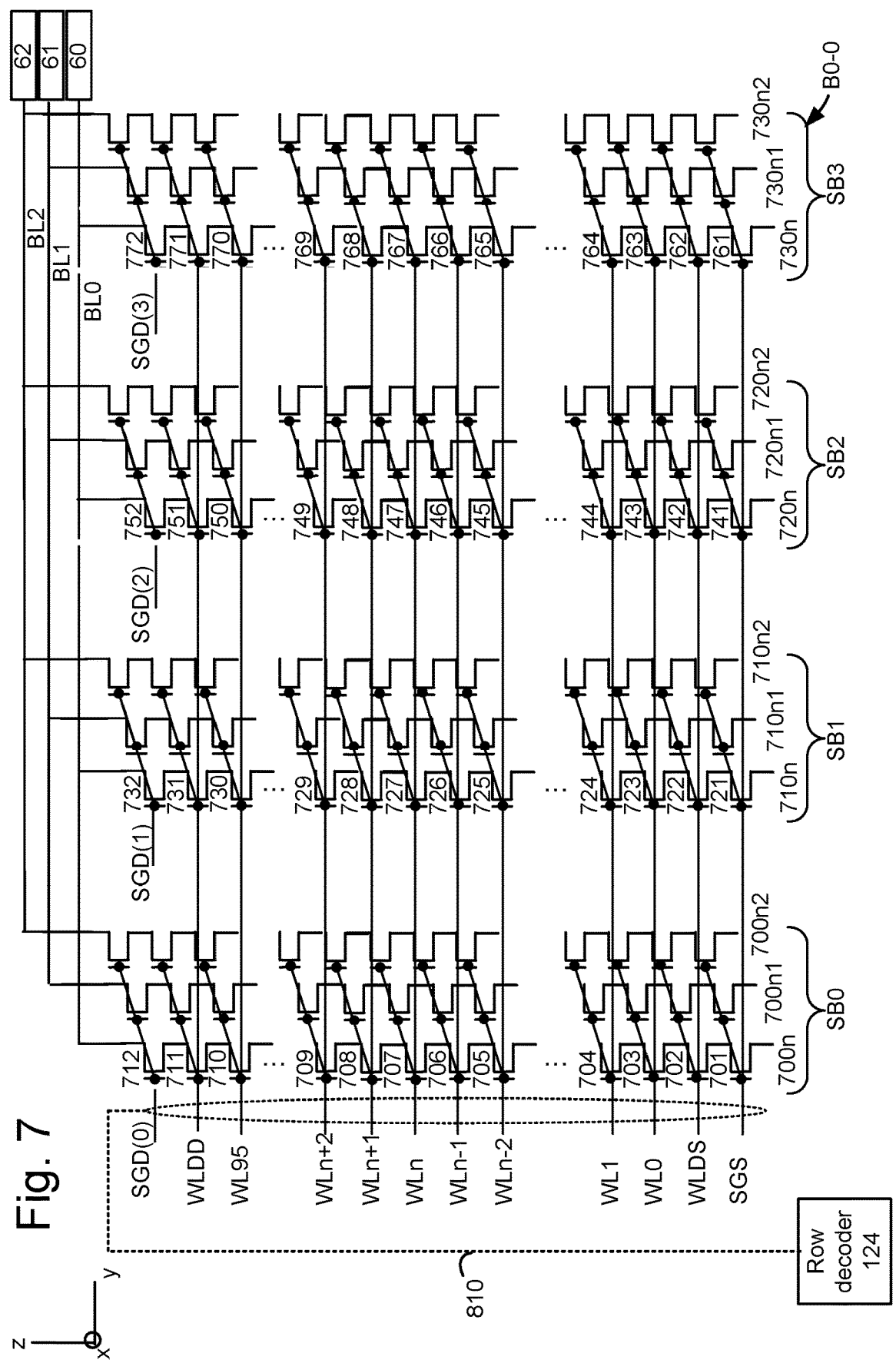

Fig. 13A

| | Er | A | B | C | D | E | F | G |
|---|---|---|---|---|---|---|---|---|
| UDL | 1 | 0 | 0 | 0 | 0 | 1 | 1 | 1 |
| MDL | 1 | 0 | 0 | 1 | 1 | 0 | 0 | 1 |
| LDL | 1 | 0 | 1 | 0 | 1 | 0 | 1 | 0 |

Fig. 13B

| | Er | A | B | C | D | E | F | G |
|---|---|---|---|---|---|---|---|---|
| OFF | n.a. | 0/1 | 0/1 | 0/1 | 0/1 | 0/1 | 0/1 | 0/1 |
| UDL | 1 | 0 | 0 | 0 | 0 | 1 | 1 | 1 |
| MDL | 1 | 0 | 0 | 1 | 1 | 0 | 0 | 1 |
| LDL | 1 | 0 | 1 | 0 | 1 | 0 | 1 | 0 |

COUNTERMEASURE FOR REDUCING PEAK CURRENT DURING PROGRAMMING BY OPTIMIZING TIMING OF LATCH SCAN OPERATIONS

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1A is a block diagram of an example memory device.

FIG. 1B is a block diagram of an arrangement of the memory device 100 of FIG. 1A in which a control circuit 130 on a first die 130a communicates with the memory structure 126 on a separate second die 126b.

FIG. 7 depicts an example view of the block B0-0 of FIG. 4, with respective NAND strings arranged in sub-blocks, along with associated bit lines and sense circuits.

FIG. 13A depicts example data latch values for an eight-state memory device, where offset verify voltages such as VvAL-VvGL in FIG. 8A are not used.

FIG. 13B depicts example data latch values for an eight-state memory device, where offset verify voltages such as VvAL-VvGL in FIG. 8A are used.

DETAILED DESCRIPTION

Apparatuses and techniques are described for avoiding current peaks during a program operation in a memory device by optimizing the timing of latch scan operations.

In some memory devices, memory cells are connected to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The select gate transistors are also referred to as select gates. Further, the memory cells can be arranged with a common control gate line (e.g., word line) which acts a control gate. A set of word lines extends from the source-side of a block to the drain-side of a block. See FIG. 7, for example. Memory cells can be connected in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. Further, each NAND string includes various layers which extend vertically in the stack, such as a blocking oxide layer, a charge trapping layer, a tunneling layer and a channel layer. See FIGS. 5 and 6, for example.

In a 2D memory structure, the memory cells may be arranged in horizontal NAND strings on a substrate.

The memory cells can be programmed to have a threshold voltage (Vth) which corresponds to a data state. See FIG. 8A, for example. The Vth is a function of an amount of charge stored in a charge storing material of the memory cell. A program operation can include a sequence of program loops, where each program loop is performed by applying a program pulse to a selected word line followed by performing one or more verify tests. See, e.g., FIG. 12, for example. In a program loop, a program pulse is applied to the selected word line. Subsequently, a verify test is performed for memory cells which have not completed programming in a prior program loop. In the verify test, the voltage of the selected word line, VWL_sel, is set to a verify voltage, the voltage of the unselected word lines, VWL_unsel, is increased from an initial level to a read pass level, Vread, and the voltage of the bit lines, Vbl, is set to a sense voltage for the memory cells which are subject to a verify test.

Figure 2:
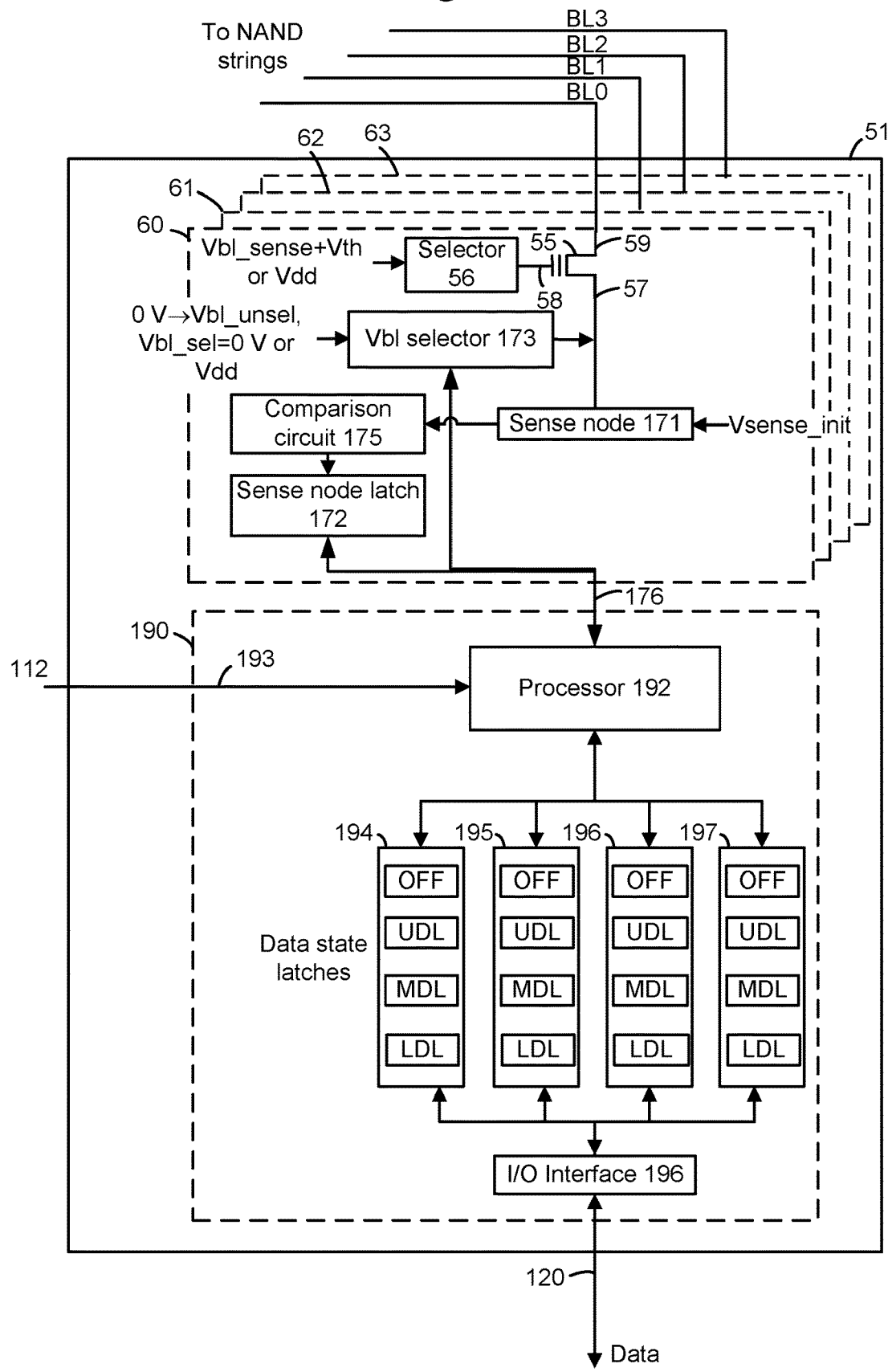
FIG. 2 is a block diagram depicting one embodiment of the sense block 51 of FIG. 1A.

To identify the memory cells subject to a verify test, a scanning operation is performed for latches associated with each NAND string. This is referred to as a pre-charge select (PCHSEL) scan operation, and is used to determine which bit lines to set to a sense voltage in the verify test. The pre-charge or PCH refers to increase the bit line voltage to the sense voltage. The select or SEL refers to selected bit lines. These latches can include a sense node latch 172 and data state latches 194-197 (FIG. 2). The sense node latch can be set in the prior program loop based on a pass/fail result of a verify test in the prior program loop, for each memory cell subject to the verify test. It is also possible to set the sense node latch in the current program loop for a few memory cells which failed the verify test in the prior program loop. For example, assume 99.5% of the A-state memory cells pass a verify test in the prior program loop and 0.5% fail. The memory cells which pass will have their latches updated in the prior program loop to indicate the pass status. Moreover, the 1% of the A-state memory cells which fail the verify test in the prior program loop will have their latches updated in the current program loop to also indicate the pass status, since the data state is considered to have completed programming. An operation referred to as an FF fill operation is used to set a pass status in the latches of these failed memory cells. FF is the hexadecimal value for a string of eight binary 1's, and denotes setting sense node latches to a 1 value to indicate a program inhibit status.

An operation referred to as a state bit scan can be performed in the current program loop to count the number of memory cells of a given data state which have a fail status. If the count is below a threshold, such as 1% of the memory cells of the given data state, the data state is considered to have completed programming and the FF fill operation is initiated. If the count is not below the threshold, the data state is not considered to have completed programming and the FF fill operation is omitted in the current program loop. The time used in the counting process can vary. The counting process takes longer when the number of failed cells is below the threshold, since the latches of every cell of a given data state have to be checked to determine if there is a failed cell.

Other operations also involve reading (scanning) and setting the latches. For example, a lockout scan is performed at the end of a given program loop to determine whether to set a bit line voltage to an inhibit or program level in a next program loop.

Figure 9:
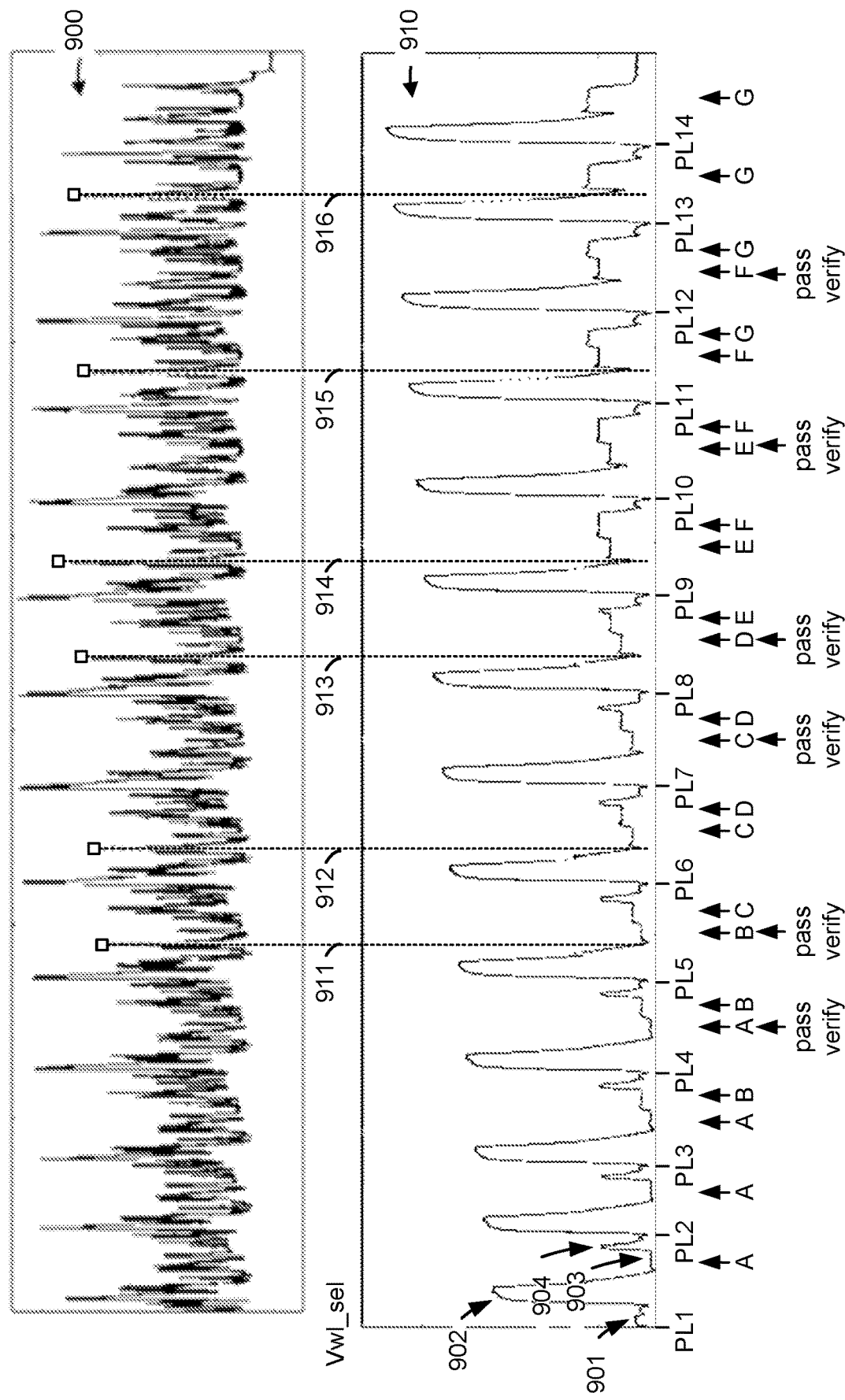
FIG. 9 depicts a plot 900 of current versus time and a corresponding plot 910 of selected word line voltage versus time in a program operation, showing how peaks in current correspond to program loops in which a verify test for a data state is passed.

However, the scan operations consume current and can cause current spikes in the memory device. In particular, a relatively large amount of current is used when increasing VWL_unsel from an initial level to a read pass level in preparation for a verify test. If a scan operation overlaps with the voltage increase, an undesirable current peak can occur. See the time period R2 in FIG. 11B, for example, where the PCHSEL scan (arrow 1163) overlaps with the VW_unsel increase (arrow 1131). Example current peaks are depicted in FIG. 9. In the option of region 1160, the PCHSEL scan occurs in the time period R1 and part of R2, and the increase of VWL_unsel is in R2, so that there is an overlap in R2. The FF fill operation occurs earlier in the program loop, just after the state bit scan.

Techniques provided herein address the above and other issues. In one approach, in the option of region 1170 of FIG. 11B, the PCHSEL scan occurs earlier, just after the state bit scan and before the VWL_unsel increase, and the FF fill operation occurs later, in the time period R3, after the increase of VWL_unsel, thus avoiding a current spike. By moving the FF scan operation to after the VWL_unsel increase, more time is made available for the PCHSEL operation before the VWL_unsel increase, and the risk of overlap with the VWL_unsel increase is reduced.

Figure 11A:
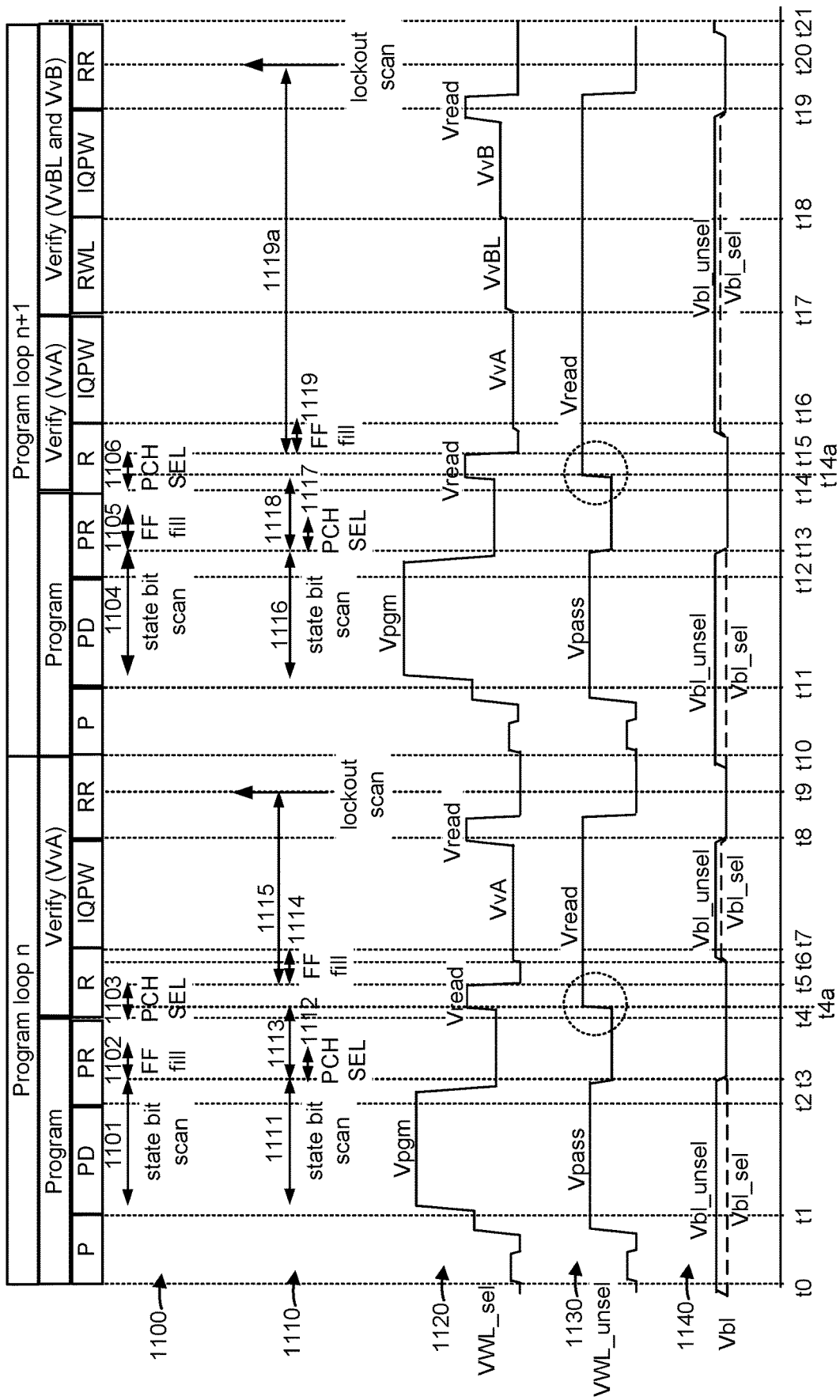
FIG. 11A depicts a first example (region 1100) and a second example (region 1110) of timings for a state bit scan, an FF fill operation and a PCHSEL scan, a plot 1120 of a selected word lines voltage, VWL_sel, a plot 1130 of an unselected word line voltage, VWL_unsel, and a plot 1140 of a bit line voltage, Vbl, in two successive program loops.
Figure 11B:
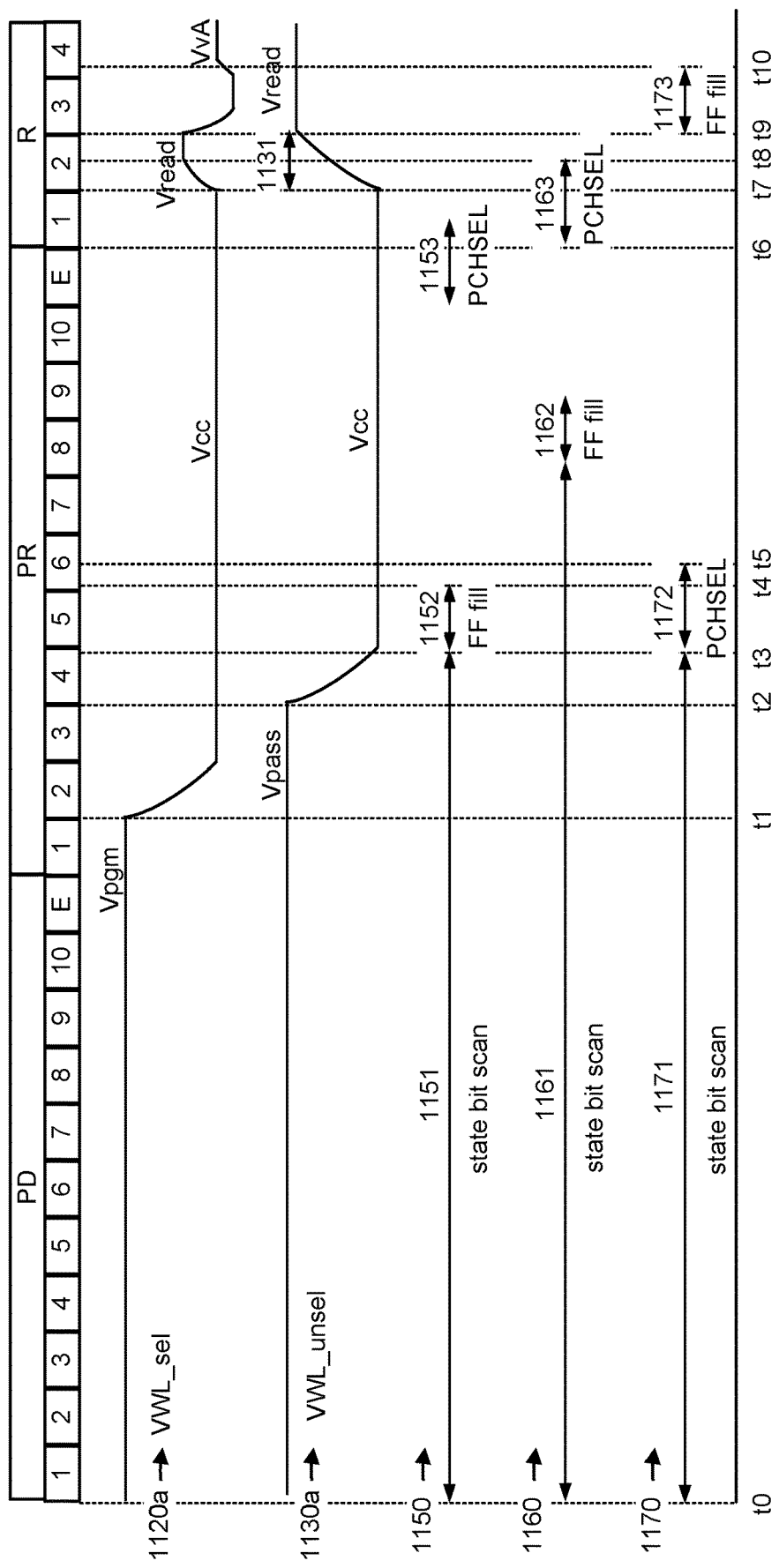
FIG. 11B depicts a close up view of a portion of program loop n in FIG. 11A.
Figure 11C:
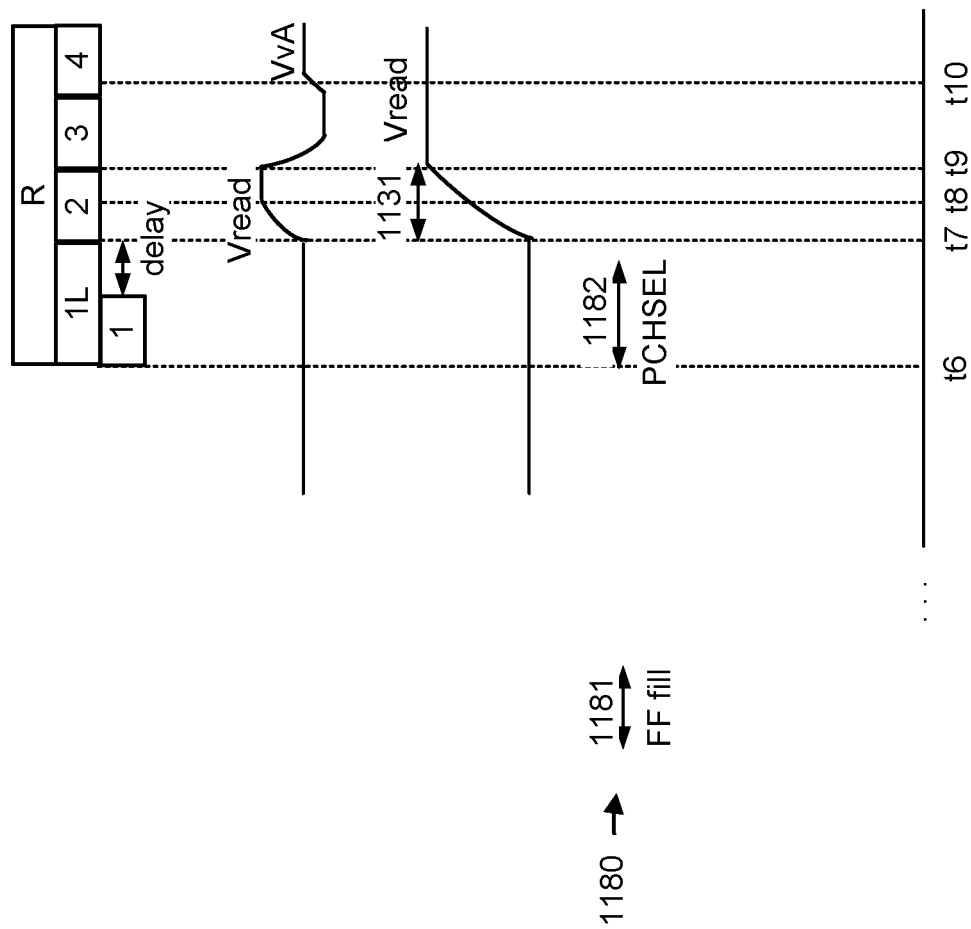
FIG. 11C depicts an alternative to the view of FIG. 11A, where the VWL_unsel increase is delayed.

In another approach, depicted in FIG. 11C, the increase in VWL_unsel is delayed. For example, see the "delay" which equals R1L-R1. In this case, more time is available for the state bit scan, FF fill operation and the PCHSEL scan before the VWL_unsel increase, so that an overlap can be avoided between the PCHSEL scan and the VWL_unsel increase in R2. Moreover, the decision to delay the VWL_unsel increase can be a function of whether a data state has completed programming in the prior program loop. As mentioned, the state scan operation in a current nth program loop will take more time when a data state has completed programming in the prior n−$1^{st}$ program loop. Also, the FF operation will be performed when a data state has completed programming in the prior program loop. As a result, without making more time available, the PCHSEL scan can be pushed back in time, potentially resulting in an overlap with the VWL_unsel increase. By delaying the VWL_unsel increase, adequate time can be provided for the state scan operation, the FF operation and the PCHSEL scan before the VWL_unsel increase.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, and a power control circuit 115. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

The control circuitry 110 may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which stores non-committed data, for example. During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The controller, e.g., RAM 122b and/or the control circuitry 110, can store parameters which indicate an expected number of fail bits in a block. These parameters can include, e.g., the number of bits per cell stored in the memory cells, a portion of the word lines which are programmed in a block or sub-block, a portion of the sub-blocks which are programmed in a block, a strength of an ECC process used to store and read data in the block, a duration of pre-read voltage pulse, if used, and a read accuracy, such as a bit line or word line voltage settling time and a number of sensing passes.

Generally, the control code can include instructions to perform the functions described herein including the steps of the flowcharts discussed further below, and provide the voltage signals including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. See an example column in FIG. 5. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B is a block diagram of an arrangement of the memory device 100 of FIG. 1A in which a control circuit 130 on a first die 130a communicates with the memory structure 126 on a separate second die 126b. The control circuit may communicate with the memory structure and the die 126b via a memory interface 131, for example, similar to the memory interface 122d. Examples of a memory interface (I/F) include the Common Flash Memory Interface of JEDEC. The techniques described herein can be implemented with a control die 130a bonded to one or more memory die 126b, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

In an example implementation, the control circuit 130 is configured to connect to a NAND string and a substrate, and the memory interface 131 is connected to the control circuit. The circuit can be configured to issue command via the memory interface to apply different voltage signals to bit lines, word lines, select gate lines, and a CELSRC line (source line), for example.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line which in turn is connected to one or more NAND strings. For example, in a configuration consistent with FIG. 7, each bit line is connected to four NAND strings, with one NAND string per sub-block. A common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. As described further below, a verify test can be performed for the memory cells connected to all of the word lines in a block, or to memory cells connected to odd- or even-numbered word lines. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 0.7 V, is the threshold voltage of the transistor 55. This assumes the source line is at 0 V. If Vcelsrc is non-zero, the bit line voltage is clamped at Vcg-Vcelsrc-Vth. The transistor is therefore sometimes referred to as a bit line clamp (BLC) transistor, and the voltage Vcg on the control gate 58 is referred to as a bit line clamp voltage, Vblc. This mode can be used during sensing operations such as read and verify operations. The bit line voltage is thus set by the transistor 55 based on the voltage output by the selector 56. For example, the selector 56 may pass Vbl_sense+Vth, e.g., 1.5 V, to the control gate of the transistor 55 to provide Vbl_sense, e.g., 0.8 V, on the bit line. A Vbl selector 173 may pass a relatively high voltage such as Vdd to the drain 57, which is higher than the control gate voltage on the transistor 55, to provide the source-follower mode during sensing operations. Vbl refers to the bit line voltage.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3 based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. The amount of decay of the sense node also indicates whether a current Icell in the memory cell exceeds a reference current, Iref. If Icell<=Iref, the memory cell is in a non-conductive state and if Icell>Iref, the memory cell is in a conductive state.

In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. For example, in a program-verify test, a 0 can denote fail and a 1 can denote pass. The bit in the sense node latch can be read out in a state bit scan operation of a PCHSEL operation, or flipped from 0 to 1 in an FF fill operation, as described herein.

The bit in the sense node latch can also be used in a lockout scan to decide whether to set a bit line voltage to an inhibit or program level in a next program loop. The latches 194-197 may be considered to be data state latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data. The latches can optionally include an offset latch (OFF) which tracks whether a memory cell has completed a verify test using an offset verify voltage which is lower than the final verify voltage of a data state. See examples of offset verify voltages in FIG. 8A.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3:
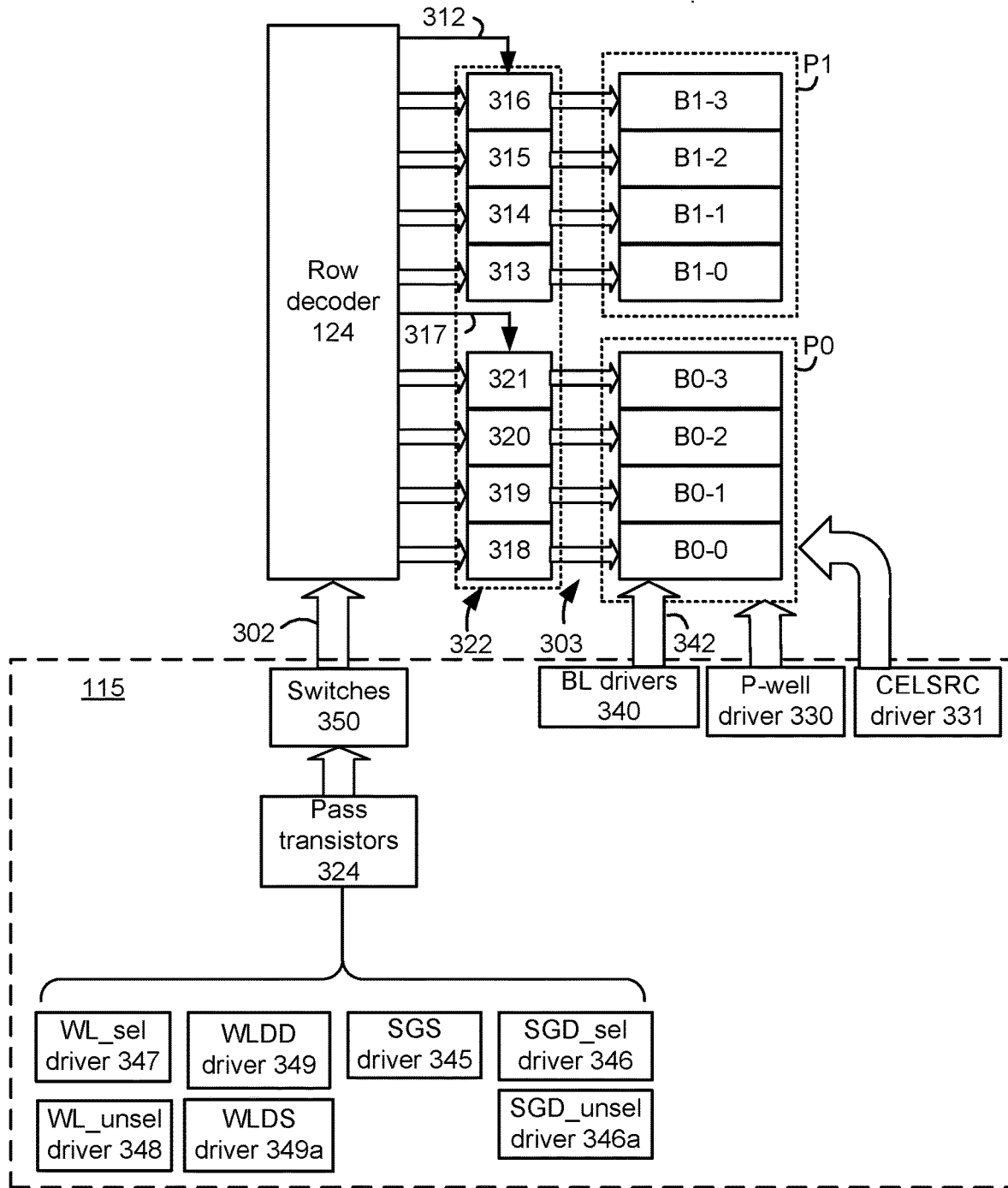
FIG. 3 depicts an example implementation of the power control circuit 115 of FIG. 1A for providing voltages to blocks of memory cells.

FIG. 3 depicts an example implementation of the power control circuit 115 of FIG. 1A for providing voltages to blocks of memory cells. The circuitry shown can be repeated for each plane of a die, in one approach. In this example, the memory structure 126 includes a set of four blocks, B0-0 to B0-3, in one plane, P0, and another set of four blocks, B1-0 to B1-3, in another plane, P1, consistent with FIG. 4. Generally, the blocks can be in one or more planes. The row decoder 124 of FIG. 1A provides voltages to word lines and select gate control lines of each block via pass transistors 322. In one approach, a separate row decoder is provided for each block. The row decoder can be provided one side of a block, such as depicted in FIG. 7. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a block enable line 312 is connected to sets of pass transistors 313-316, which in turn are connected to select gate and word lines of B1-0 to B1-3, respectively. A block enable line 317 is connected to sets of pass transistors 318-321, which in turn are connected to select gate and word lines of B0-0 to B0-3, respectively. The control signal on the block enable line 317 is therefore an enable signal for a set of blocks B0-0 to B0-3, and the control signal on the block enable line 312 is an enable signal for a set of blocks B1-0 to B1-3.

Typically, program or read operations are performed on one selected sub-block at a time in a block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

A number of voltage drivers can be provided that are connected to the pass transistors. For example, a selected data word line driver, WL_sel driver 347, provides a voltage signal on a data word line which is selected during a program or read operation. In one approach, the WL_unsel driver 348 provides a common voltage signal on each of unselected data word lines. In another approach, multiple drivers can be used to provide different voltage signals on different groups of unselected word lines.

In some cases, additional drivers are provided for the WLn−1 and WLn+1, the adjacent word lines of WLn.

Dummy word line drivers are also provided. The WLDD driver 349 provides a voltage signal on the drain-side dummy word line, WLDD, and the WLDS driver 349a provides a voltage signal on the source-side dummy word line, WLDS.

The voltage drivers can also include an SGS driver 345 which is common to the different sub-blocks in a block, in one example. This driver provides a voltage signal to a control line connected to the control gates of the SGS transistors (source-side select gate transistors). In another option, a separate SGS driver is provided for each sub-block.

The voltage drivers can also include a SGD_sel driver 346 for the SGD transistors of a selected sub-block of a block involved in an operation, and a SGD_unsel driver 346a for the SGD transistors of unselected sub-blocks of the block. In another option, a separate SGD driver is provided for each sub-block. The SGD drivers provide a voltage to a control line connected to the control gates of an SGD transistor (drain-side select gate transistor).

The various components, including the row decoder, may receive commands from a controller such as the state machine 112 or the controller 122 to perform the functions described herein.

The p-well voltage driver 330 provides a voltage Vp-well to the p+ contact 524 in the p-well region 592, e.g., via the conductive path 524a. See FIG. 5. In one approach, the p-well region 592 is common to a set of blocks. A set of bit lines 342 is also shared by the blocks. A source line voltage driver, referred to as a CELSRC driver 331, provides a voltage Vcelsrc to a source end of a NAND string. For example, Vcelsrc can be provided to the n+contact 523 in the p-well region 592, e.g., via the local interconnect 523a in FIG. 5.

Bit line voltage drivers 340 include voltage sources which provide voltages to the bit lines 342. The bit line voltage for sensing can be 0.5 V, for example.

Figure 4:
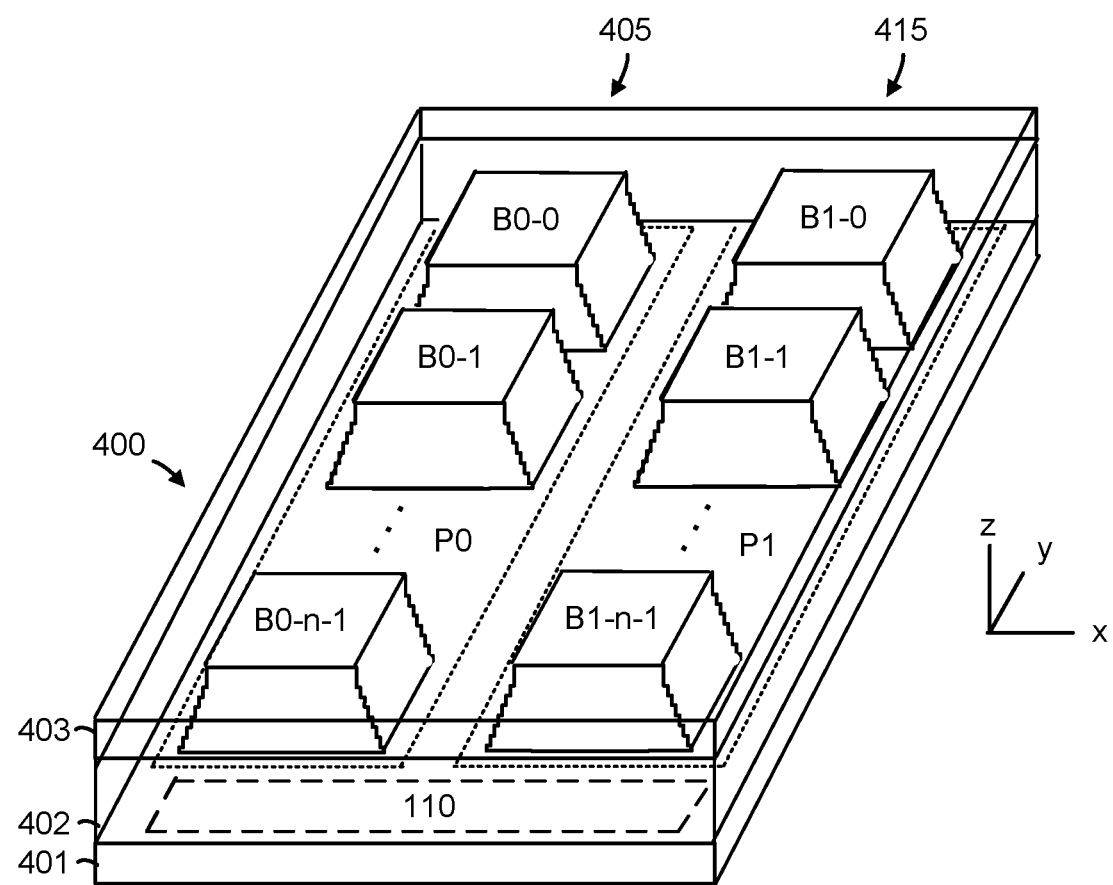
FIG. 4 is a perspective view of an example memory die 400 in which blocks are provided in respective planes P0 and P1, consistent with FIG. 3.

FIG. 4 is a perspective view of an example memory die 400 in which blocks are provided in respective planes P0 and P1, consistent with FIG. 3. The memory die includes a substrate 401, an intermediate region 402 in which blocks of memory cells are formed, and an upper region 403 in which one or more upper metal layers are patterned such as to form bit lines. Planes P0 and P1 represent respective isolation regions which are formed in the substrate 401. Further, a first block sequence 405 of a number n blocks, labelled B0-0 to B0-$n$−1, are formed in P0, and a second block sequence 415 of a number n blocks, labelled B1-0 to B1-$n$−1, are formed in P1. Each plane may have associated row and column control circuitry, such as the row decoder 124, read/write circuits 128 and column decoder 132 of FIG. 1A.

The control circuitry 110, which may be located in a peripheral area of the die, may be shared among the planes, in one approach. Each plane may have a separate set of bit lines.

By providing blocks of memory cells in multiple planes, parallel operations can be performed in the planes. For example, blocks in a different planes can be erased concurrently.

The substrate 401 can also carry circuitry under the blocks, and one or more lower metal layers which are patterned in conductive paths to carry signals of the circuitry.

Figure 5:
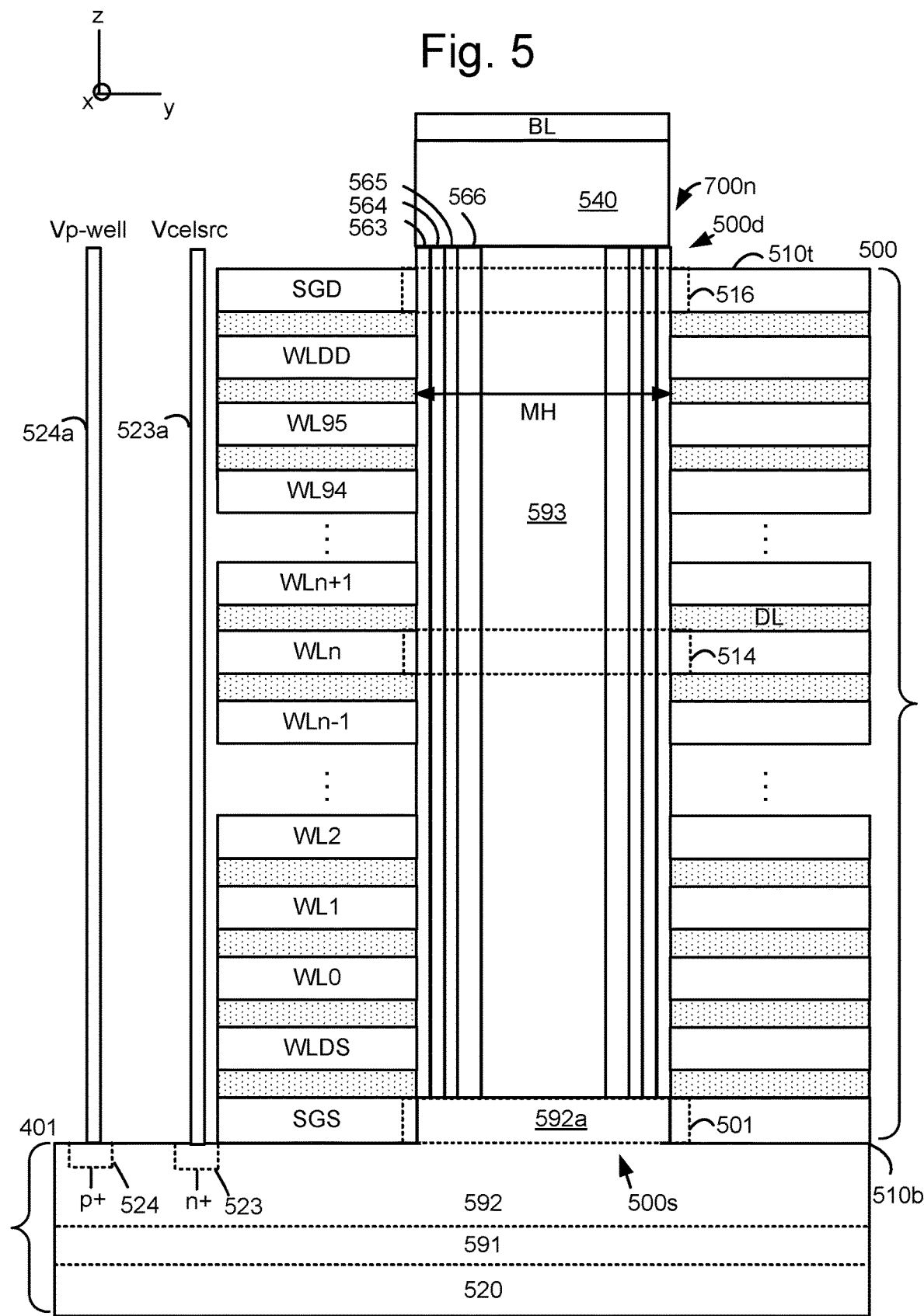
FIG. 5 depicts an example cross-sectional view of a portion of the block B0-0 of FIG. 4, including a NAND string 700n.

In this example, the memory cells are formed in vertical NAND strings in the blocks, consistent with FIG. 5. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

FIG. 5 depicts an example cross-sectional view of a portion of the block B0-0 of FIG. 4, including a NAND string 700n. The block comprises a stack 500 of alternating conductive layers (e.g., select gate layers and word line layers) and dielectric layers. The layers may be rectangular plates having a height in the z direction, a width in the y direction, and a length in the x direction. Example conductive layers include SGS, WLDS, WL0, WL1, WL2, . . . , WLn−1, WLn, WLn+1, WL94, WL95, WLDD and SGD. WLn denotes a selected word line for a read or program operation. The dielectric layers are shown by a dotted pattern and include an example dielectric layer DL. The conductive layers extend in a memory hole MH (see also FIG. 6).

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0), in addition to 96 data word lines in this example, although the number of data word lines could be greater or less than 96.

The conductive layers connected to control gates of memory cells are referred to as word lines, and the conductive layers connected to control gates of source-side select gate transistors and drain-side select gate transistors are referred to as source-side and drain-side control lines, respectively. WLDS and WLDD are dummy word lines or conductive layers connected to dummy memory cells. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data.

A top 510t and bottom 510b of the stack are depicted. WL95 is the topmost data word line and WL0 is the bottommost data word line.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 516 is formed where the SGD control line intersects with the multiple thin layers, a source-side select gate transistor 501 is formed where the SGS control line intersects with the multiple thin layers, and a selected memory cell 514 is formed where WLn intersects with the multiple thin layers.

The multiple thin annular layers can be deposited, e.g., using atomic layer deposition. For example, the layers can include a blocking oxide layer 563, a charge-trapping layer 564 or film such as silicon nitride (Si3N4) or other nitride, a tunneling layer 565 (e.g., a gate oxide) and a channel layer 566 (e.g., comprising polysilicon). A dielectric core 593 (e.g., comprising silicon dioxide) can also be provided. In this example, all of the layers are provided in the memory hole. In other approaches, some of the layers can be provided in the word line or control line layer. The multiple thin layers form a columnar active area of a NAND string. A word line or control line can comprise a metal such as Tungsten.

The stack is formed on the substrate 401. In one approach, the substrate includes a p-well region 592 connected to the source ends of the NAND strings. The p-well region may comprise an epitaxial region 592a which extends upward adjacent to the SGS layer. The p-well region can include an n+contact 523 connected to a local interconnect 523a (a conductive path or source line) for receiving Vcelsrc, and a p+contact 524 connected to a conductive path 524a for receiving Vp-well. The local interconnect and conductive path can comprise a conductive material such as metal surrounded by an insulating material to prevent conduction with the metal of the adjacent word lines. The p-well region 592 can be formed in an n-well 591, which in turn is formed in a p-type semiconductor region 520 of the substrate, in one possible implementation.

The NAND string 700n has a source end 500s at a bottom 510b of the stack 500, connected to the p-well. The NAND string 500n also has a drain end 500d at a top 510t of the stack, connected to a bit line BL0 via a bit line contact 540 comprising an n-type material.

The NAND string in this 3D configuration is considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate, causing the electrons to return to the channel from the charge trapping layer.

Figure 6:
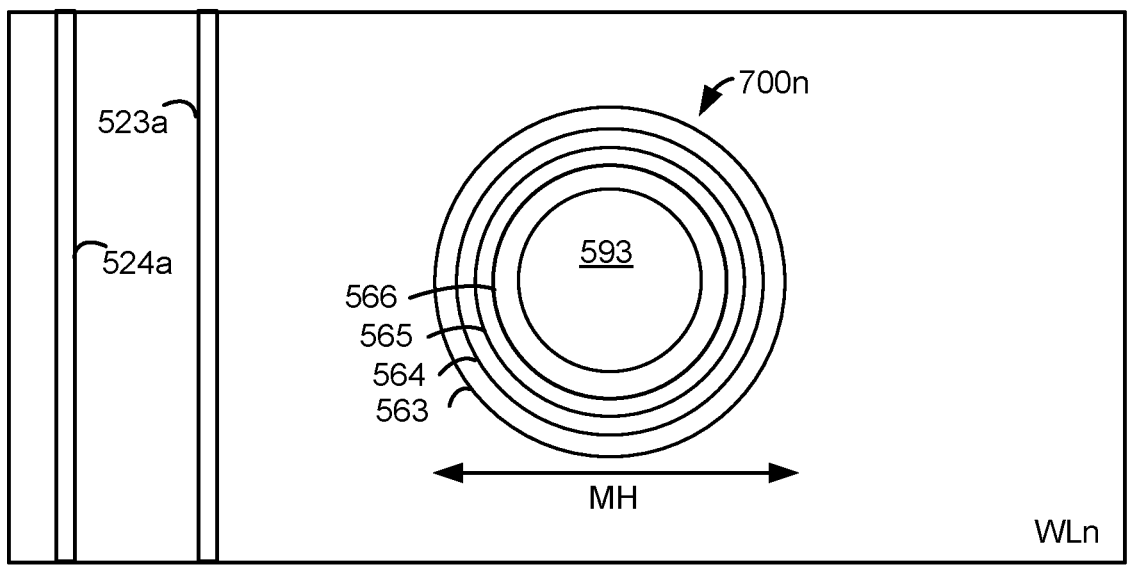
FIG. 6 depicts an example cross-sectional view of the block portion of FIG. 5 in the x-y plane at the level of WLn.

FIG. 6 depicts an example cross-sectional view of the block portion of FIG. 5 in the x-y plane at the level of WLn. The layers of the NAND string 700n are depicted, including the blocking oxide layer 563, charge-trapping layer 564, tunneling layer 565 and the channel layer 566. The dielectric core 593 is also depicted.

FIG. 7 depicts an example view of the block B0-0 of FIG. 4, with respective NAND strings arranged in sub-blocks, along with associated bit lines and sense circuits. The set of word lines WL0-WL95 are connected to memory cells arranged in NAND strings. The NAND strings are arranged in sub-blocks of the block in a 3D configuration. The block is consistent with FIGS. 5 to 7. Each sub-block SB0-SB3 includes multiple NAND strings. Three example NAND strings are depicted, as a simplification. For example, SB0 comprises NAND strings 700n, 700n1 and 700n2, SB1 comprises NAND strings 710n, 710n1 and 710n2, SB2 comprises NAND strings 720n, 720n1 and 720n2, and SB3 comprises NAND strings 730n, 730n1 and 730n2. The NAND strings have data word lines, dummy word lines and select gate lines. Each sub-block comprises a set of NAND strings which extend in the x direction and which have a common SGD line or control gate layer. In particular, SGD(0)-SGD(3) are in SB0-SB3, respectively.

Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. In one option, referred to as a regular programming order, the word line programming order may start at WL0, the source end word line and end at WL95, the drain end word line, for example. In another option, referred to as a reverse programming order, the programming starts from the highest word line, e.g., WL95, and ends at the lowest word line, e.g., WL0. This option can provide reduced neighbor word line interference.

Reading can occur for memory cells connected to a selected word line in a selected sub-block. Reading can occur one sub-block at a time.

In an erase operation, typically the entire block is erased, although a partial block erase is also possible.

Each NAND string comprises a plurality of memory cells between an SGS transistor and a SGD transistor, in this example. In other examples, more than one SGD and/or SGS transistor can be provided for each NAND string. The number of dummy memory cells can also vary. For example, the NAND string 700n includes an SGS transistor 701, a dummy memory cell 702, data memory cells 703-710, a dummy memory cell 711 and an SGD transistor 712. The NAND string 710n includes an SGS transistor 721, a dummy memory cell 722, data memory cells 723-730, a dummy memory cell 731 and an SGD transistor 732. The NAND string 720n includes an SGS transistor 741, a dummy memory cell 742, data memory cells 743-750, a dummy memory cell 751 and an SGD transistor 752. The NAND string 730n includes an SGS transistor 761, a dummy memory cell 762, data memory cells 763-770, a dummy memory cell 771 and an SGD transistor 772.

This example depicts one SGD transistor at the drain end of each NAND string, and one SGS transistor at the source end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

A set of bit lines, including example bit lines BL0-BL2, are connected to the NAND strings. Each bit line is connected to a respective set of NAND strings, including one NAND string in each sub-block. For example, BL0 is connected to NAND strings 700n, 710n, 720n and 730n in SB0-SB3, respectively, BL1 is connected to NAND strings 700n1, 710n1, 720n1 and 730n1 in SB0-SB3, respectively, and BL2 is connected to NAND strings 700n2, 710n2, 720n2 and 730n2 in SB0-SB3, respectively. Each bit line is also connected to a respective sense circuit, consistent with the sense circuits of FIG. 2. For example, BL0-BL2 are connected to sense circuits 60-62, respectively.

The row decoder 124 is at one side of the block in this example, in a peripheral area of the substrate, consistent with the control circuitry 110 depicted in FIG. 4. The row decoder routes voltage signals to the word line via conductive paths 810. In one approach, the conductive paths extend vertically in the z direction to the upper region 403, then horizontally in the y direction and then vertically down in the −z direction in vias which contact the word lines. The side of the block may have a stair step shape in which the vias can contact an edge of each word line. In this example, it is assumed that the stair step shape is closest to SB0. As a result, the RC delay of a word line voltage signal will be smallest for SB0 and largest for SB3. The distance between the row decoder and the sub-blocks is considered to increase progressively for SB0-SB3.

Figure 8A:
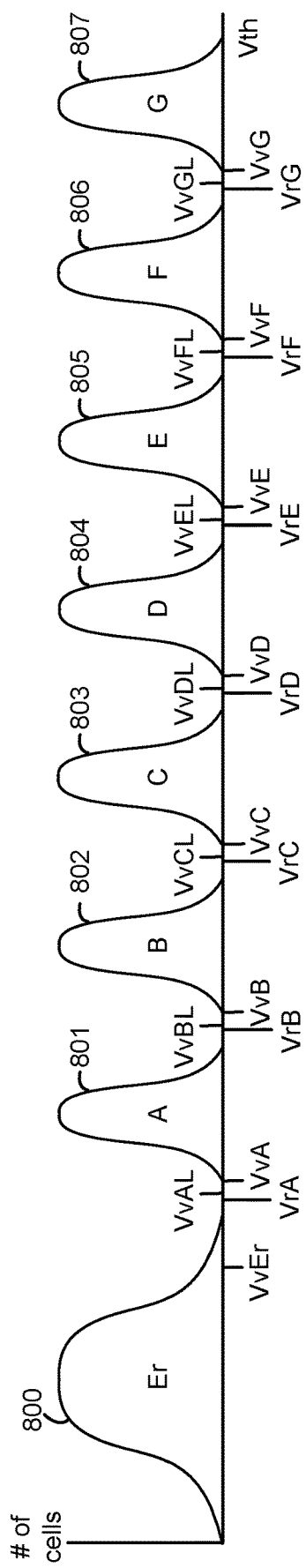
FIG. 8A depicts threshold voltage (Vth) distributions for an eight-state memory device.

FIG. 8A depicts threshold voltage (Vth) distributions for an eight-state memory device. Eight data states, or three bits per cell, are depicted as an example. The techniques herein can apply to other modes, including one or more bits per cell. The vertical axis depicts a number of memory cells on a logarithmic scale and the horizontal axis depicts a threshold voltage on a linear scale. The Vth distributions can represent memory cells connected to a word line or all memory cells in a block. After erasing the block, the Vth distribution of plot 900 is obtained, representing the erased state. The erase operation is completed when the Vth of all, or nearly all, of the memory cells is below a verify voltage of VvEr.

The memory cells are then subject to a programming operation. Each of the memory cells will have an assigned data state. Some of the memory cells are assigned to the erased state, as represented by Vth distribution 800, and are not programmed Most of the memory cells are programmed to higher states, such as A-F, in this example, as represented by Vth distributions 801-807, respectively. These memory cells are subject to verify tests using verify voltages of VvA-VvG. Optionally, offset verify voltages VvAL-VvAG which are lower than the respective final verify voltages VvA-VvG, respectively can be used. When an A-state memory cell passes a verify test at VvAL, for example, it can continue programming in one or more additional program loops. However, its bit line voltage is raised to a positive voltage during the program pulses of the one or more additional program loops to reduces its program speed. This helps provide narrower Vth distributions. An OFF latch such as discussed in connection with FIGS. 2 and 13B can be used for this purpose.

In a read operation, the memory cells can be read by applying the read voltages VrA-VrG applied to the selected word line. The data which is programmed or read can be arranged in pages. In one approach, one page of data is read at a time. For example, with eight data states a lower page of data can be read using VrA and VrE, a middle page of data can be read using VrB, VrD and VrF, and an upper page of data can be read using VrC and VrG.

Figure 8B:
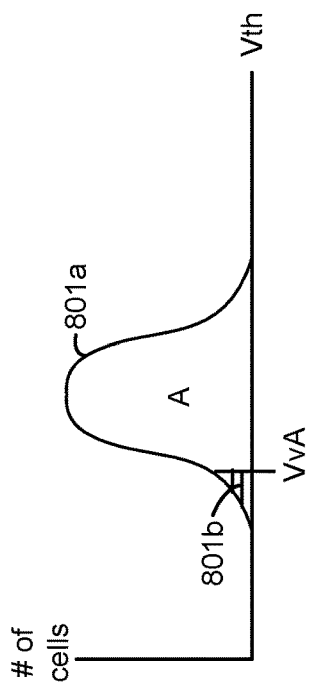
FIG. 8B depicts an A-state Vth distribution and the counting of memory cells with a Vth<VvA.

FIG. 8B depicts an A-state Vth distribution and the counting of memory cells with a Vth<VvA. The A-state memory cells have a Vth distribution 801a. The A-state memory cells are memory cells which are assigned to the A state. These memory cells can be identified by their data state latches. See also FIGS. 13A and 13B. A lower tail (region 801b) of the Vth distribution represents A-state memory cells which have Vth<VvA and fail the verify test while a remainder of the Vth distribution represents A-state memory cells which have VvA>Vth and pass the verify test. As mentioned, in the state bit scan, a count is made of the memory cells which fail a verify test. For example, a control circuit can access the data state latches to identify the A-state memory cells, then determine if their sense node latch has a 0 or 1, where a 0 denotes fail verify and a 1 denotes pass verify. The count can be of the number of 0's, for example. If the count is below a threshold number, such as 1% of the A-state memory cells, the data state is considered to have completed programming and the FF fill operation is initiated. If the count is above the threshold, the data state is not considered to have completed programming and the FF fill operation is not initiated. Generally, a data state passes a verify test in a program loop when a number of memory cells which fail the verify test is less than a threshold number.

FIG. 9 depicts a plot 900 of current versus time and a corresponding plot 910 of selected word line voltage versus time in a program operation, showing how peaks in current correspond to program loops in which a verify test for a data state is passed. The program operation includes fourteen program loops, PL1-PL14. Each loop includes a pre-charge period 901, a program pulse 902, a verify voltage 903 and a post-verify channel clean voltage 904. The channel clean voltage 904 is a spiked up voltage which equalizes the channel potential. A pre-verify Vread spike is also applied but is difficult to observe in FIG. 9 since the timing is compressed to improve performance. The Vread spike is between the program pulse 902 and the verify voltage 903, about when the voltage falls from the peak program voltage to a valley. See also FIGS. 11A and 12. The Vread spikes help avoid injection disturb on dummy memory cells, especially at low temperatures and after program-erase cycling.

Plot 900 indicates that the current spikes during the pre-charging, due to the increase of the bit line voltages to a pre-charge level. This is because the bit lines have a relatively high capacitance. These bit line-based current spikes have a pattern in which the spike is larger for midrange program loops and smaller for earlier and later program loops in the program operation, due to a higher bit line-to-bit line capacitance during the midrange program loops.

The current also spikes at certain time which are denotes by squares in the plot 900. These times correspond to a VWL_unsel increase. Moreover, these spikes do not follow a pattern which is based on the program loops number. Instead, as discussed, these spikes occur when the PCHSEL scan overlaps with the VWL_unsel increase. Further, this overlap occurs when a data state completes programming in the previous program loop. In this case, the state bit scan requires more time in the current program loop, pushing the PCHSEL scan back in the current program loop to the point where it can overlap with the VWL_unsel increase. These spikes are expected to be more prominent in future memory device in which the word line layers become thinner, and the number of word line layers increases, thereby increasing word line-to-channel capacitance and requiring more peak current (Icc) to drive a higher voltage on them.

The notation below the plot 910 identifies the data states being verified in each program loop, and whether there is a verify pass, denoting the completion of programming for a data state. PL1 and PL2 verify the A state with no verify pass. PL3 verifies the A and B states with no verify pass. PL4 verifies the A and B states with a verify pass for the A state. In the next program loop, PL5, the time line 911 indicates a current spike.

PL5 verifies the B and C states with a verify pass for the B state. In the next program loop, PL6, the time line 912 indicates a current spike. PL6 verifies the C and D states with no verify pass. PL7 verifies the C and D states with a verify pass for the C state. In the next program loop, PL8, the time line 913 indicates a current spike. PL8 verifies the D and E states with a verify pass for the D state. In the next program loop, PL9, the time line 914 indicates a current spike. PL9 verifies the E and F states with no verify pass. PL10 verifies the E and F states with a verify pass for the E state. In the next program loop, PL11, the time line 915 indicates a current spike. PL11 verifies the F and G states with no verify pass. PL12 verifies the F and G states with a verify pass for the F state. In the next program loop, PL13, the time line 916 indicates a current spike. PL13 verifies the G state with no verify pass. PL14 verifies the G state with a verify pass, but there is no following program loop for a current spike to occur.

Figure 10A:
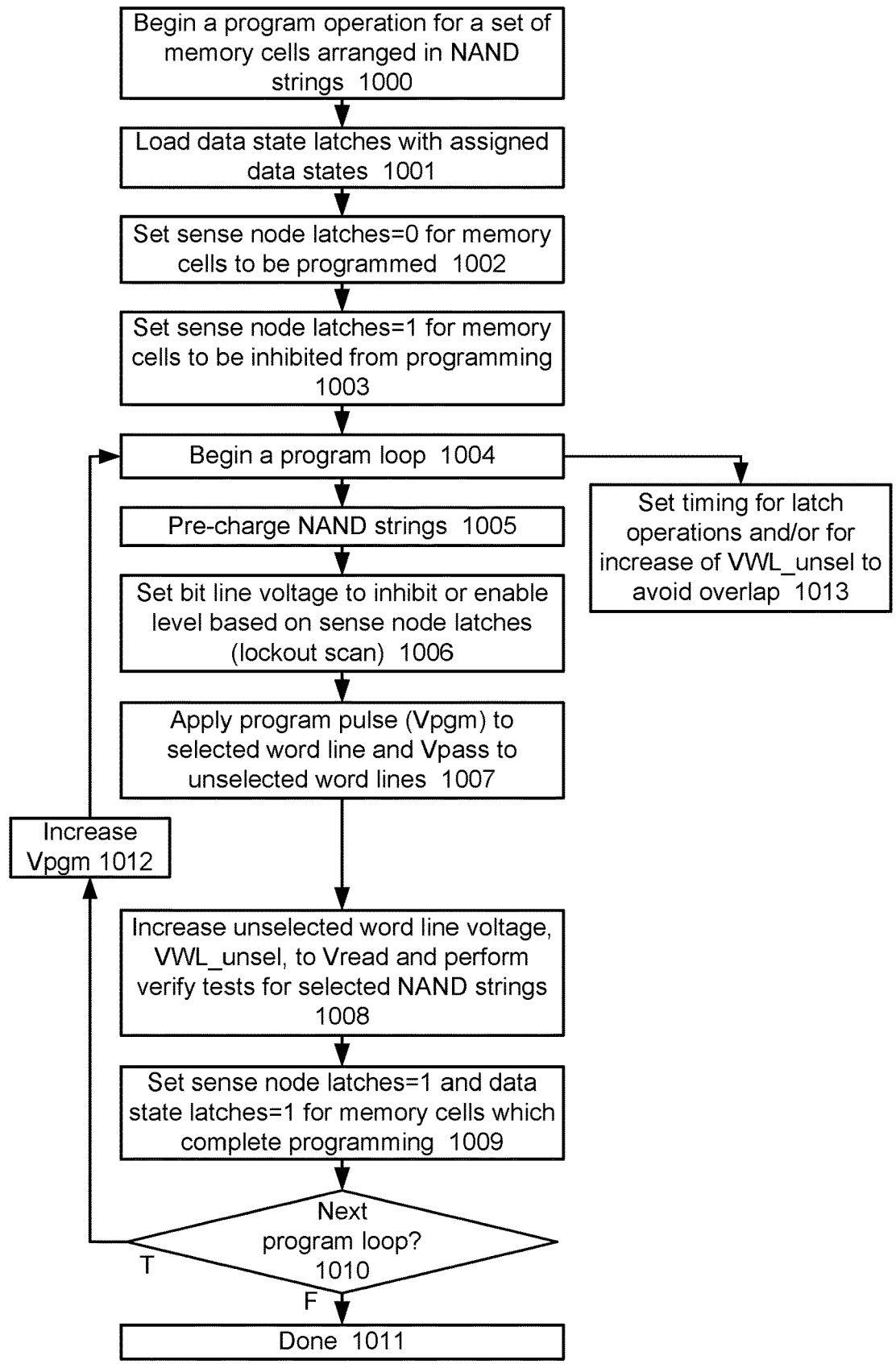
FIG. 10A depicts an flowchart of an example program operation in which the timing of latch scan and fill operations is optimized relative to the increase of the unselected word lines to Vread to avoid a current peak.

FIG. 10A depicts an flowchart of an example program operation in which the timing of latch scan and fill operations is optimized relative to the increase of the unselected word lines to Vread to avoid a current peak. Step 1000 begins a program operation for a set of memory cells arranged in NAND strings. Step 1001 includes loading data state latches, e.g., LDL, MDL and UDL, with assigned data states. See, e.g., FIGS. 2, 13A and 13B. Step 1002 includes setting the sense node latches=0 for memory cells to be programmed Step 1003 includes setting the sense node latches=1 for memory cells to be inhibited from programming.

Step 1004 begins a program loop. Step 1005 involves pre-charging the NAND strings, e.g., their channels. This can involve applying a small positive voltage, e.g., 1-2 V, to the bit lines and/or source lines while providing the memory cells and select gate transistors in a conductive state to pass the voltage along the channel. This pre-charging removes residue electrons and provide a small amount of channel boosting.

Step 1006 involves setting a bit line voltage to a program inhibit or enable level for unselected and selected NAND strings, respectively, based on the sense node latches. A selected NAND string comprises a select memory cell for which programming is enabled and an unselected NAND string comprises an unselected memory cell for which programming is inhibited. Vbl=0 V can be used to enable programming while a positive voltage such as 2 V can be used to inhibit programming In one approach, a latch value=1 denotes inhibit and a latch value=0 denotes program. This reading of the sense node latches is referred to as a lockout scan since it determines which NAND strings will be locked out (inhibited) from programming.

Step 1007 includes applying a program pulse (having a peak voltage Vpgm) to a selected word line and a pass voltage, e.g., 8-10 V to unselected word lines.

Step 1008 includes increasing the unselected word line voltage, VWL_unsel, to Vread, e.g., 8-10 V, and performing verify tests for selected NAND strings.

Step 1009 includes setting the sense node latches=1 and data state latches=1 for memory cells which complete programming, based on a result of step 1008. As depicted in FIGS. 13A and 13B, having the data state latches=1 denotes the erased state which is locked out from programming.

A decision step 1010 determines whether there is a next program loop in the program operation. The decision step is false and the program operation is done at step 1011 if all states have completed programming. The decision step is true if not all states have completed programming, in which case step 1012 increases Vpgm and a next program loop begins at step 1004.

Step 1013 include setting the timing for the latch operations and/or for the increase of VWL_unsel to avoid an overlap which can result in a current peak, as discussed.

Figure 10B:
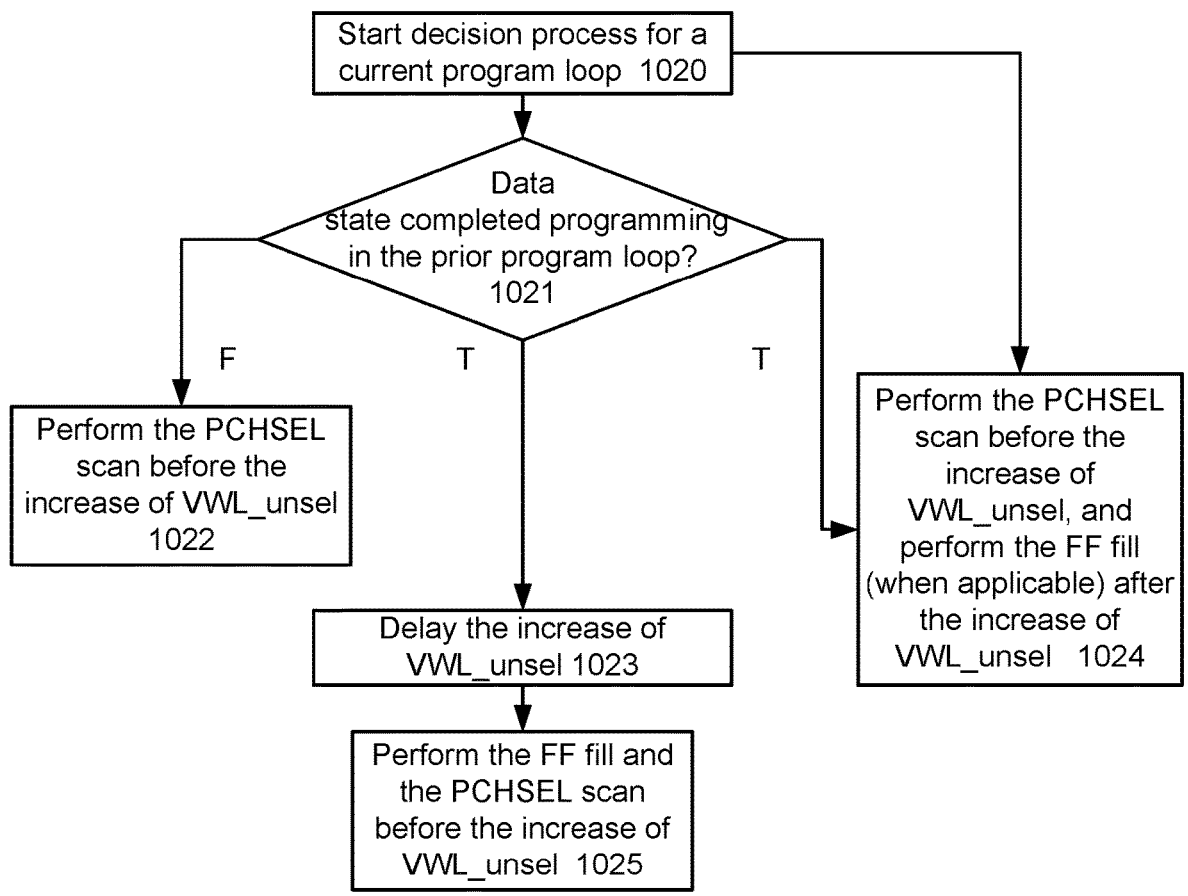
FIG. 10B depicts a flowchart of an example decision process for implementing step 1013 of FIG. 10A.

FIG. 10B depicts a flowchart of an example decision process for implementing step 1013 of FIG. 10A. Step 1020 starts the decision process for a current program loop. In one option, the process proceeds directly to step 1024, which involves performing the PCHSEL scan before the increase of VWL_unsel, and performing the FF fill operation (when applicable) after the increase of VWL_unsel. See FIG. 11A, region 1110 and FIG. 11B, region 1170.

In another option, the timing for the latch operations and/or the increase of VWL_unsel is a function of whether a data state completed programming in the prior program loop, in the decision step 1021. The prior program loop refers to the immediately prior program loop of the current program loop, in one approach. If the decision step is false, step 1022 involves performing the PCHSEL scan before the increase of VWL_unsel. See FIG. 11A, region 1110 and FIG. 11B, region 1150 but without the FF fill operation. If the decision step is true, step 1023 involves delaying the increase of VWL_unsel and step 1025 involves performing the FF fill operation and the PCHSEL scan before the increase of VWL_unsel. See FIG. 11C.

FIG. 11A depicts a first example (region 1100) and a second example (region 1110) of timings for a state bit scan, an FF fill operation and a PCHSEL scan, a plot 1120 of a selected word lines voltage, VWL_sel, a plot 1130 of an unselected word line voltage, VWL_unsel, and a plot 1140 of a bit line voltage, Vbl, in two successive program loops. Time points t0-t21 are also depicted. In this example, an nth program loop comprises a program portion and verify portion which performs a verify test using VvA. An n+1st program loop comprise a program portion, a verify portion which performs a verify test using VvA, and a verify portion which performs verify tests using VvBL and VvB.

Various time periods are depicted in the program and verify portions. For example, in program loop n, the program portion comprises time periods P (a pre-charge phase) from t0-t1, PD (a program phase) from t1-t2 and PR (a program recovery phase) from t2-t4 and the verify portion comprises time periods R (a word line ramp up phase) from t4-t7, IQPW (a verify phase for a final verify voltage) from t7-t8 and RR (a recovery phase) from t8-t10. In program loop n+1, the program portion comprises time periods P from t10-t11, PD from t11-t12 and PR from t12-t14. The VvA verify portion comprises time periods R from t14-t16 and IQPW from t16-t17. The VvBL and VvB portion comprises time periods RWL (a verify phase for an offset verify voltage) from t17-t18, IQPW from t18-t19, and RR from t19-t21.

In the region 1100, in the program loop n, the state bit scan (arrow 1101) extends in the PD and PR time periods and is followed by the FF fill operation (arrow 1102) in the PR time period and the PCHSEL scan (arrow 1103) in the R time period. However, the PCHSEL scan overlaps with the VWL_unsel increase (circled region) in the plots 1120 and 1130, respectively, potentially resulting in a current spike, as discussed. The overlap is also with the VWL_sel increase, which further increases current consumption. Similarly, the program loop n+1 includes the state bit scan (arrow 1104), FF fill operation (arrow 1105) and the PCHSEL scan (arrow 1106).

Generally, the state bit scan involve counting memory cells with a verify fail status in the prior program loop. This can involve one or more data states. Typically, no more than one data state will complete programming in a program loop. The time used in the state bit scan is therefore variable.

In the region 1110, in the program loop n, the state bit scan (arrow 1111) extends in the PD and PR time periods, as in the region 1100, and is followed by the PCHSEL scan (arrow 1112) in the PR time period, before the increase of VWL_sel and VWL_unsel. The FF fill operation (arrow 1114) in the R time period, after the increase of VWL_sel and VWL_unsel. The arrow 1113 denotes a time period in which the PCHSEL scan can occur, from t3 to the start time of the increase of the word line voltages at t4a. The arrow 1115 denotes a time period in which the FF fill operation can occur, from t5-t9, where a lockout scan occurs at t9.

In the region 1110, in the program loop n+1, the state bit scan (arrow 1116) extends in the PD and PR time periods, and is followed by the PCHSEL scan (arrow 1117) in the PR time period, before the increase of VWL_sel and VWL_unsel. The FF fill operation (arrow 1119) in the R time period, is after the increase of VWL_sel and VWL_unsel. The arrow 1118 denotes a time period in which the PCHSEL scan can occur, from t13 to the start time of the increase of the word line voltages at t14a. The arrow 1119a denotes a time period in which the FF fill operation can occur, from t15-t20, where a lockout scan occurs at t20.

Generally, the pre-charge select (PCHSEL) scan should occur before the time in which the bit line voltages are increased for a verify test. The FF fill operation should be performed before the lockout scan and the associated setting of the bit line voltages for the next program loop.

The plot 1120 depicts VWL_sel. The voltage increases to a small positive level just after t0 to allow channel pre-charging. A program pulse at a level of Vpgm is then applied, and a recovery period follows. Subsequently, VWL_sel may be spiked up to Vread, lowered to 0 V and then increased to VvA for the verify test of program loop n. VWL_sel may be spiked up an additional time to Vread, and then lowered to 0 V at the end of the program loop at t10.

A similar pattern is repeated in program loop n+1. VWL_sel is set to verify voltages of VvA, VvBL and VvB in this example. The use of offset verify voltages such as VvBL is optional.

The plot 1130 depicts VWL_unsel. The voltage increases to a small positive level just after t0 to allow channel pre-charging and then increases to Vpass when the program pulse is applied. A recovery follows. Subsequently, VWL_unsel is increased to Vread at t4a for the verify test. VWL_unsel is then lowered to 0 V at the end of the program loop at t10. A similar pattern is repeated in program loop n+1.

The plot 1140 depicts Vbl. During the pre-charge, Vbl is set to a higher level, Vbl_unsel, for unselected NAND strings and to a lower level such as 0 V for selected NAND strings. This allows the pre-charge to occur in unselected NAND strings. Similarly, during the verify test, Vbl is set to a higher level, Vbl_unsel, for unselected NAND strings and to a lower level such as Vsense, e.g., 0.5 V, for selected NAND strings. A similar pattern is repeated in program loop n+1.

FIG. 11B depicts a close up view of a portion of program loop n in FIG. 11A. The plot 1120a is part of the plot 1120 of FIG. 11A. The time points are t0-t10 and are different than in FIG. 11A. VWL_sel is initially at Vpgm then decreases to Vcc, e.g., 3 V, at t1. VWL_sel then spikes up to Vread at t7-t9, returns to 0 V at t9 and increases to VvA at t10.

The plot 1130a is part of the plot 1130 of FIG. 11A. VWL_unsel is initially at Vpass then decreases to a recovery level, e.g., Vcc, at t2. VWL_unsel increases from the initial level, e.g., Vcc, to Vread at t7-t9, in a time period denoted by an arrow 1131, and is maintained at Vread.

In the region 1150, the state bit scan occurs (arrow 1151), followed by the FF fill operation (arrow 1152), a time gap, and then the PCHSEL scan (arrow 1153). During the gap, the control circuit may be busy with other tasks. In this example, the PCHSEL scan is completed before t7 so there is no overlap with the VWL_unsel increase.

In the region 1160, the state bit scan (arrow 1161) takes a relatively long time. As mentioned, the counting operation of the state bit scan can be prolonged when a verify test has been passed in a prior program loop. The FF fill operation (arrow 1162) then occurs, followed by a time gap and then the PCHSEL scan (arrow 1163). In this case, the PCHSEL scan is pushed back in time due to the prolonged state bit scan and the FF fill operation so that it overlaps with the VWL_unsel increase at t7-t8.

In the region 1170, the state bit scan occurs (arrow 1171), followed by the PCHSEL scan (arrow 1172), a time gap and then the FF fill operation (arrow 1173). In this case, the FF fill operation is moved to after the VWL_unsel increase. This makes room for the PCHSEL scan before the VWL_unsel increase.

Generally, the durations of the clock periods can be any floating number and can be set as a function of the program loop number. Moreover, the techniques disclosed herein can be used for any selected word line and sub-block in a program operation. The techniques can be used with any word line program order, including a normal word line program order, e.g., from WL0-WL95, or a reverse word line program order, e.g., from WL95-WL0. Similarly, the techniques can be used with any order of verify voltages in the verify portion of a program loop, including an ascending order, from a lowest verify voltage to a highest verify voltage, and a descending ascending order, from a highest verify voltage to a lowest verify voltage. Moreover, a Vread spike can be used before the verify tests and a channel clean voltage can be used after the verify tests, as discussed in connection with FIG. 9. Further, the techniques apply to multiple bits per cell, including two or more bits per cell.

FIG. 11C depicts an alternative to the view of FIG. 11A, where the VWL_unsel increase is delayed. The R1 clock period can be increased from R1 to R1L, representing the "delay." The time point t7 is therefore later than in FIG. 11B.

In this example, the region 1180 depicts the FF fill operation (arrow 1181), a time gap, and then the PCHSEL scan (arrow 1182). Due to the delay of the VWL_unsel increase, there is no overlap with the PCHSEL scan.

In one possible approach, the PCHSEL scan is set to begin at the start time of the R1 time period but can be delayed when the state bit scan takes a long time, as discussed. By elongating the R1 time period to R1L, even if the PCHSEL scan is pushed back so that it begins after the start time of R1L, there will still be sufficient time to complete the scan before the end of R1L and the start time of R2, when VWL_unsel starts to increase.

Figure 12:
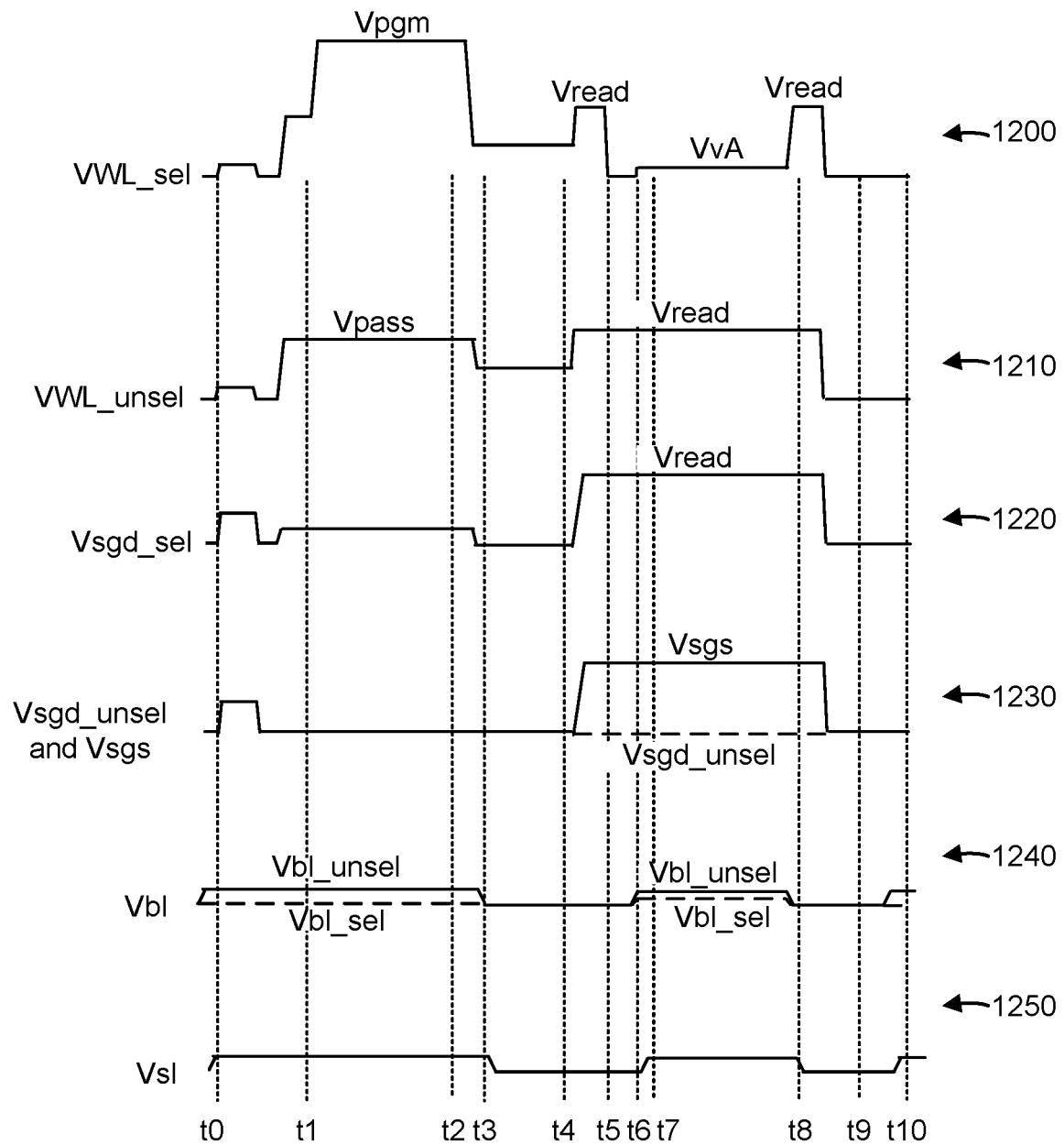
FIG. 12 depicts example plots for various voltage signals in program loop n of FIG. 11A.

FIG. 12 depicts example plots for various voltage signals in program loop n of FIG. 11A. A plot 1200 depicts VWL_sel and a plot 1210 depicts VWL_unsel, as discussed. A plot 1220 depicts Vsgd_sel, the voltage for SGD transistors of a selected sub-block. Vsgd_sel is elevated during the pre-charge, to provide the SGD transistor in a conductive state, and then returned to 0 V during the program pulse. With Vbl elevated to Vbl_unsel, the SGD transistors of the unselected NAND strings will be in a non-conductive state to inhibit programming With Vbl=0 V (Vbl_sel), the SGD transistors of the unselected NAND strings will be in a conductive state to allow programming to occur. Vsgd_sel is set to Vread during the verify test to allow sensing to occur.

A plot 1230 depicts Vsgd_unsel, the voltage for SGD transistors of an unselected sub-block, and Vsgs. These voltages are elevated during the pre-charge, to provide the SGD and SGS transistors in a conductive state, and then returned to 0 V during the program pulse. Vsgs is set to Vread during the verify test to allow sensing to occur. Vsgd_unsel is kept at 0 V to provide the corresponding SGD transistors in a non-conductive state, to avoid interfering with the sensing of the selected NAND strings.

A plot 1240 depicts Vbl. Vbl_sel is the voltage for bit lines connected to selected NAND strings and Vbl_unsel is the voltage for bit lines connected to unselected NAND strings. In the pre-charge and during the program pulse, Vbl_unsel is elevated and Vbl_sel=0 V. During the verify test, Vbl_sel is elevated to Vsense to allow sensing to occur and Vbl_unsel is elevated to a higher level which turns off the SGD transistor.

A plot 1250 depicts Vsl, the source line voltage. Vsl can be elevated during the pre-charge, the program pulse and the verify test.

FIG. 13A depicts example data latch values for an eight-state memory device, where offset verify voltages such as VvAL-VvGL in FIG. 8A are not used. A series of three bits identifies each assigned data state, including the erased state and the programmed states A-G. When a memory cell assigned to a programmed state completes programming, its bits are set to the same series as the erased state, e.g., all 1's, to denote that no further programming should occur. Each of the LDL, MDL and UDL latches, as discussed in connection with FIG. 2, stores a bit. In one example, the LDL/MDL/UDL latches store 1/1/1, 0/0/0, 1/0/0', 0/1/0, 1/1/0, 0/0/1, 1/0/1 and 0/1/1 for the Er-G states, respectively.

FIG. 13B depicts example data latch values for an eight-state memory device, where offset verify voltages such as VvAL-VvGL in FIG. 8A are used. In addition to the LDL, MDL and UDL latches, the OFF latch stores a bit indicating whether the associated memory cell has passes the verify test for the offset verify voltage of a data state. For example, OFF=1 may denote pass and OFF=0 may denote did not pass.

Accordingly, it can be see that in one implementation, an apparatus comprises: a control circuit configured to connect to a set of memory cells, the set of memory cells are arranged in NAND strings and connected to a set of word lines, each NAND string is connected to respective latches, and the control circuit, to perform a program operation for the set of memory cells, is configured to: apply a program pulse to a selected word line of the set of word lines in a current program loop of the program operation; and in connection with a verify test in the current program loop which follows the applying of the program pulse, perform a pre-charge select scan of the latches to identify memory cells subject to the verify test in the current program loop, increase a bit line voltage to a sense voltage for the identified memory cells subject to the verify test, and increase voltages of unselected word lines of the set of word lines from an initial level to a read pass level for the verify test, the pre-charge select scan is timed to not overlap with the increasing of the voltages of the unselected word lines from the initial level to the read pass level.

In another implementation, a method comprises: applying a program pulse to a selected word line of a set of word lines in a current program loop of a program operation, the set of word lines are connected to a set of memory cells, the set of memory cells are arranged in NAND strings and each NAND string is connected to respective latches; preparing for a verify test in the current program loop which follows the applying of the program pulse, the preparing for the verify test comprises performing a pre-charge select scan of the latches to identify memory cells subject to the verify test in the current program loop, increasing a bit line voltage to a sense voltage for the identified memory cells subject to the verify test, and increasing voltages of unselected word lines of the set of word lines from an initial level to a read pass level, the pre-charge select scan is timed to not overlap with the increasing of the voltages of the unselected word lines from the initial level to the read pass level; and performing the verify test while the bit line voltage is at the sense voltage for the identified memory cells subject to the verify test and the voltages of the unselected word lines of the set of word lines are at the read pass level.

In another implementation, an apparatus comprises: a control circuit configured to connect to a set of memory cells, the set of memory cells are arranged in NAND strings and connected to a set of word lines, each NAND string is connected to respective latches, and the set of memory cells are configured to be programmed to a plurality of data states; a memory interface connected to the control circuit, the control circuit is configured to issue a command via the memory interface to: a) perform a verify test of a data state in a prior program loop which is before a current program loop; b) in the current program loop, perform a state bit scan to determine whether the data state passes the verify test of the prior program loop; c) in the current program loop, increase voltages of unselected word lines of the set of word lines from an initial level to a read pass level in connection with a verify test of a data state in the current program loop; and d) set a start time for the increasing of the voltages of the unselected word lines of the set of word lines from the initial level to the read pass level as a function of whether the data state passes the verify test of the prior program loop.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a control circuit configured to connect to a set of memory cells, the set of memory cells are arranged in NAND strings and connected to a set of word lines, each NAND string is connected to respective latches, and the control circuit, to perform a program operation for the set of memory cells, is configured to:
apply a program pulse to a selected word line of the set of word lines in a current program loop of the program operation; and
in connection with a verify test in the current program loop which follows the applying of the program pulse, perform a pre-charge select scan of the latches to identify memory cells subject to the verify test in the current program loop, increase a bit line voltage to a sense voltage for the identified memory cells subject to the verify test, and increase voltages of unselected word lines of the set of word lines from an initial level to a read pass level for the verify test, the pre-charge select scan is timed to not overlap with the increasing of the voltages of the unselected word lines from the initial level to the read pass level.

2. The apparatus of claim 1, wherein:
the control circuit is configured to perform a verify test of a data state in a prior program loop which is before the current program loop, and during the current program loop, perform a state bit scan of the latches to determine whether the data state passes the verify test of the prior program loop, and set a start time for the increasing of the voltages of the unselected word lines from the initial level to the read pass level as a function of whether the data state passes the verify test of the prior program loop.

3. The apparatus of claim 2, wherein:
the start time is later when the data state passes the verify test of the prior program loop than when the data state does not pass the verify test.

4. The apparatus of claim 1, wherein:
the control circuit is configured to perform a verify test for a data state in a prior program loop which is before the current program loop, and during the current program loop, perform a state bit scan of the latches to determine whether the data state passes the verify test of the prior program loop, the data state passes the verify test of the prior program loop when a number of memory cells which fail the verify test is less than a threshold number, and to perform a fill operation for latches for the memory cells which fail the verify test to indicate that their programming is completed;
when the data state passes the verify test of the prior program loop, the pre-charge select scan is performed before the increasing of the voltages of the unselected word lines from the initial level to the read pass level and the fill operation is performed after the increasing of the voltages of the unselected word lines from the initial level to the read pass level; and
when the data state does not pass the verify test of the prior program loop, the pre-charge select scan and the fill operation are performed before the increasing of the voltages of the unselected word lines from the initial level to the read pass level.

5. The apparatus of claim 1, wherein:
the control circuit is configured to perform a verify test for a data state in a prior program loop which is before the current program loop, and during the current program loop, perform a state bit scan to determine that the data state passes the verify test of the prior program loop, the data state passes the verify test of the prior program loop when a number of memory cells which fail the verify test is less than a threshold number, and to perform a fill operation for latches of the memory cells which fail the verify test to indicate that their programming is completed.

6. The apparatus of claim 5, wherein:
the fill operation is timed to not overlap with the increasing of the voltages of the unselected word lines from the initial level to the read pass level.

7. The apparatus of claim 5, wherein:
the state bit scan is timed to not overlap with the increasing of the voltages of the unselected word lines from the initial level to the read pass level.

8. The apparatus of claim 5, wherein:
the pre-charge select scan is performed prior to the increasing of the voltages of the unselected word lines from the initial level to the read pass level, and the fill operation is performed after the increasing of the voltages of the unselected word lines from the initial level to the read pass level.

9. A method, comprising:
applying a program pulse to a selected word line of a set of word lines in a current program loop of a program operation, the set of word lines are connected to a set of memory cells, the set of memory cells are arranged in NAND strings and each NAND string is connected to respective latches;
preparing for a verify test in the current program loop which follows the applying of the program pulse, the preparing for the verify test comprises performing a pre-charge select scan of the latches to identify memory cells subject to the verify test in the current program loop, increasing a bit line voltage to a sense voltage for the identified memory cells subject to the verify test, and increasing voltages of unselected word lines of the set of word lines from an initial level to a read pass level, the pre-charge select scan is timed to not overlap with the increasing of the voltages of the unselected word lines from the initial level to the read pass level; and
performing the verify test while the bit line voltage is at the sense voltage for the identified memory cells subject to the verify test and the voltages of the unselected word lines of the set of word lines are at the read pass level.

10. The method of claim 9, further comprising:
performing a verify test of a data state in a prior program loop which is before the current program loop;
during the current program loop, perform a state bit scan of the latches to determine whether the data state passes the verify test of the prior program loop; and
delay the increasing of the voltages of unselected word lines of the set of word lines from the initial level to the read pass level when the data state passes the verify test of the prior program loop.

11. The method of claim 10, wherein:
the delay is sufficiently long to prevent the pre-charge select scan from overlapping with the increasing of the voltages of the unselected word lines from the initial level to the read pass level.

12. The method of claim 10, wherein
the data state passes the verify test of the prior program loop when a number of memory cells which fail the verify test is less than a threshold number, the method further comprising, when the data state passes the verify test of the prior program loop, performing a fill operation for latches of the memory cells which fail the verify test to indicate that their programming is completed.

13. The method of claim 12, further comprising:
timing the fill operation to not overlap with the increasing of the voltages of the unselected word lines from the initial level to the read pass level.

14. The method of claim 12, further comprising:
performing the pre-charge select scan prior to the increasing of the voltages of the unselected word lines from the initial level to the read pass level; and
performing the fill operation after the increasing of the voltages of the unselected word lines from the initial level to the read pass level.

15. An apparatus, comprising:
a control circuit configured to connect to a set of memory cells, the set of memory cells are arranged in NAND strings and connected to a set of word lines, each NAND string is connected to respective latches, and the set of memory cells are configured to be programmed to a plurality of data states;
a memory interface connected to the control circuit, the control circuit is configured to issue a command via the memory interface to:
 perform a verify test of a data state in a prior program loop which is before a current program loop;
 in the current program loop, perform a state bit scan to determine whether the data state passes the verify test of the prior program loop;
 in the current program loop, increase voltages of unselected word lines of the set of word lines from an initial level to a read pass level in connection with a verify test of a data state in the current program loop; and
 set a start time for the increasing of the voltages of the unselected word lines of the set of word lines from the initial level to the read pass level as a function of whether the data state passes the verify test of the prior program loop.

16. The apparatus of claim 15, wherein:
the start time is later when the data state passes the verify test of the prior program loop than when the data state does not pass the verify test.

17. The apparatus of claim 15, wherein:
the data state passes the verify test of the prior program loop when a number of memory cells which fail the verify test is less than a threshold number, and the control circuit is configured to issue a command via the memory interface to perform a fill operation for latches of memory cells which fail the verify test to indicate that their programming is completed, the fill operation is timed to not overlap with the increasing of the voltages of the unselected word lines from the initial level to the read pass level.

18. The apparatus of claim 17, wherein the control circuit is configured to issue a command via the memory interface to:
in the current program loop, perform a pre-charge select scan of the latches to identify memory cells subject to the verify test in the current program loop, the pre-charge select scan is timed to not overlap with the increasing of the voltages of the unselected word lines from the initial level to the read pass level.

19. The apparatus of claim 18, wherein:
the fill operation occurs before the pre-charge select scan, and the pre-charge select scan occurs before the start time.

20. The apparatus of claim 18, wherein:
the control circuit is configured to issue a command via the memory interface to increase a bit line voltage to a sense voltage for the identified memory cells subject to the verify test in the current program loop.

* * * * *